（12）United States Patent
Wolk et al.

(10) Patent No.: US 10,957,878 B2
(45) Date of Patent: Mar. 23, 2021

(54) STRUCTURED LAMINATION TRANSFER FILMS AND METHODS

(71) Applicant: 3M INNOVATIVE PROPERTIES COMPANY, St. Paul, MN (US)

(72) Inventors: Martin B. Wolk, Woodbury, MN (US); Mieczyslaw H. Mazurek, Roseville, MN (US); Sergey Lamansky, Redmond, WA (US); Margaret M. Vogel-Martin, Forest Lake, MN (US); Vivian W. Jones, Woodbury, MN (US); Olester Benson, Jr., Woodbury, MN (US); Michael Benton Free, Stillwater, MN (US); Evan L. Schwartz, Vadnais Heights, MN (US); Randy S. Bay, Woodbury, MN (US); Graham M. Clarke, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 143 days.

(21) Appl. No.: 15/692,296

(22) Filed: Aug. 31, 2017

(65) Prior Publication Data

US 2017/0365818 A1 Dec. 21, 2017

Related U.S. Application Data

(63) Continuation of application No. 13/553,987, filed on Jul. 20, 2012, now Pat. No. 9,780,335.

(51) Int. Cl.
*H01L 51/52* (2006.01)
*B32B 37/00* (2006.01)
(Continued)

(52) U.S. Cl.
CPC ........ *H01L 51/5275* (2013.01); *B32B 37/025* (2013.01); *B32B 2037/268* (2013.01);
(Continued)

(58) Field of Classification Search
CPC ............ H01L 51/5275; H01L 27/3258; B32B 37/025; B32B 2309/02; B32B 2309/12;
(Continued)

(56) References Cited

U.S. PATENT DOCUMENTS 6,027,595 A 2/2000 Suleski
6,329,058 B1 12/2001 Arney
(Continued)

FOREIGN PATENT DOCUMENTS

CN 1433358 A 7/2003
CN 100446192 12/2008
(Continued)

OTHER PUBLICATIONS

Chiniwalla, "Multilayer planarization of polymer dielectics", IEEE Transaction on Advanced packaging, Feb. 2001, vol. 24, No. 1, pp. 41-53.
(Continued)

*Primary Examiner* — Thomas L Dickey
(74) *Attorney, Agent, or Firm* — Jonathan L. Tolstedt

(57) ABSTRACT

Lamination transfer films and methods for transferring a structured layer to a receptor substrate. The transfer films include a carrier substrate having a releasable surface, a sacrificial template layer applied to the releasable surface of the carrier substrate and having a non-planar structured surface, and a thermally stable backfill layer applied to the non-planar structured surface of the sacrificial template layer. The sacrificial template layer is capable of being removed from the backfill layer, such as via pyrolysis, while leaving the structured surface of the backfill layer substantially intact.

1 Claim, 12 Drawing Sheets

(51) Int. Cl.
  *B32B 37/26* (2006.01)
  *H01L 27/32* (2006.01)
(52) U.S. Cl.
  CPC ....... *B32B 2309/02* (2013.01); *B32B 2309/12* (2013.01); *B32B 2309/14* (2013.01); *B32B 2457/12* (2013.01); *B32B 2457/20* (2013.01); *B32B 2457/206* (2013.01); *H01L 27/3258* (2013.01); *Y10T 428/24612* (2015.01)
(58) Field of Classification Search
  CPC ............ B32B 2309/14; B32B 2457/12; B32B 2457/20
  See application file for complete search history.

(56) References Cited

U.S. PATENT DOCUMENTS

| | | | |
|---|---|---|---|
| 6,366,013 | B1 | 4/2002 | Leenders |
| 6,396,079 | B1 | 5/2002 | Hayashi |
| 6,521,324 | B1 | 2/2003 | Debe |
| 6,770,337 | B2 | 8/2004 | Debe |
| 6,849,558 | B2 | 2/2005 | Schaper |
| 7,384,809 | B2 | 6/2008 | Donofrio |
| 7,504,699 | B1 | 3/2009 | Kohl |
| 7,604,381 | B2 | 10/2009 | Hebrink |
| 8,077,379 | B2 | 12/2011 | Gousev |
| 8,179,034 | B2 | 5/2012 | Potts |
| 2003/0138555 | A1* | 7/2003 | Debe .................. B41M 5/38207 427/152 |
| 2003/0219992 | A1 | 11/2003 | Schaper |
| 2006/0270806 | A1 | 11/2006 | Hale |
| 2007/0037307 | A1* | 2/2007 | Donofrio ............ H01L 33/0095 438/42 |
| 2007/0042174 | A1 | 2/2007 | Rao et al. |
| 2007/0236774 | A1 | 10/2007 | Gousev |
| 2007/0298176 | A1* | 12/2007 | DiPietro ................ B82Y 10/00 427/355 |
| 2009/0015142 | A1* | 1/2009 | Potts ...................... B82Y 20/00 313/504 |
| 2009/0256287 | A1 | 10/2009 | Fu |
| 2009/0322219 | A1 | 12/2009 | Wolk |
| 2010/0006211 | A1 | 1/2010 | Wolk |
| 2010/0079701 | A1* | 4/2010 | Murayama ........... G02B 5/0226 349/64 |
| 2010/0104807 | A1* | 4/2010 | Chiu ........................ B44C 1/17 428/142 |
| 2010/0151207 | A1 | 6/2010 | Hansen et al. |
| 2010/0160577 | A1 | 6/2010 | Hirano |
| 2011/0058150 | A1 | 3/2011 | Schaper |
| 2011/0151278 | A1* | 6/2011 | Gurney ................ G11B 5/3106 428/800 |
| 2011/0182805 | A1* | 7/2011 | DeSimone ............ A61K 9/0097 424/1.11 |
| 2011/0229992 | A1 | 9/2011 | Potts |
| 2011/0241051 | A1 | 10/2011 | Carter et al. |
| 2011/0278772 | A1 | 11/2011 | Inamiya |
| 2011/0305787 | A1 | 12/2011 | Ishii |
| 2011/0317269 | A1* | 12/2011 | Paolilli ................ B32B 37/025 359/576 |
| 2012/0099323 | A1 | 4/2012 | Thompson |
| 2012/0153527 | A1 | 6/2012 | Banerjee |
| 2012/0261788 | A1* | 10/2012 | Lin .................. H01L 21/31127 257/506 |
| 2013/0011608 | A1 | 1/2013 | Wolk |
| 2013/0105770 | A1* | 5/2013 | Pschenitzka ........ H01L 51/5203 257/40 |
| 2013/0319522 | A1 | 12/2013 | Koike |
| 2015/0207107 | A1 | 7/2015 | Schwartz |

FOREIGN PATENT DOCUMENTS

| | | |
|---|---|---|
| CN | 101443691 A | 9/2012 |
| EP | 1003078 | 5/2000 |
| JP | 2002-093315 | 3/2002 |
| TW | 200900245 | 1/2009 |
| WO | WO 2003-012459 | 2/2003 |
| WO | WO 2004/02746 | 4/2004 |
| WO | WO 2007/120464 A1 | 10/2007 |
| WO | WO 2008/118610 | 10/2008 |
| WO | WO 2012/077738 | 6/2012 |

OTHER PUBLICATIONS

Han, Fabrication of Complex nanoscale structures on various substrates, Applied Physics Letters, 2007, vol. 91, pp. 123118.1-123118.3.

Huang, "Reversal imprinting by transferring polymer from mold to substrate", Journal of Vac. Science Technology, 2002, pp. 2872-2876.

Jin, "Solving Efficiency-Stability Tradeoff in Top-Emitting Organic Light-Emitting Devices by Employing Periodically Corrugated Metallic Cathode" Advanced Materials, Mar. 2, 2012, vol. 24, No. 9, pp. 1187-1191.

Kim, "Effect of the substrate pretreatments on the leakage current in the low- temperature poly-Si TFTs", Mat. Res. Soc. Symp. Proc., 1997, vol. 448, pp. 419-423.

Kondoh, "Surface treatment of sheet glass. present status and future prospects", Journal of Non-Crystalline Solids, 1994, vol. 178, pp. 189-198.

Kress, "Applied Digital Optics: Form Micro-Optics to Nan photonics", 15-20 (2009).

Mistler, "Tape Casting: Theory and Practice", Binders, 7-62 (2000).

Nien, "Directional photoluminescence enhancement of organic emitters via surface plasmon coupling", Applied Physics Letters, Mar. 2009, vol. 94, pp. 103304-1-103304-3.

Ro, "High-Modulus Spin-On Organosilicate Glasses for Nanoporous Applications", Advanced Materials, Feb. 2007, vol. 19, No. 5, pp. 705-710.

Office Action—Taiwan Patent Application 102123690, dated Oct. 28, 2016.

Office Action—Taiwan Patent Application 102123690, dated Oct. 28, 2016 (Partial Translation).

* cited by examiner

STRUCTURED LAMINATION TRANSFER FILMS AND METHODS

BACKGROUND

Nanostructures and microstructures on glass substrates are used for a variety of applications in display, lighting, and solar devices. In display devices the structures can be used for light extraction or light distribution. In lighting devices the structures can be used for light extraction, light distribution, and decorative effects. In photovoltaic devices the structures can be used for solar concentration and antireflection. Patterning or otherwise forming nanostructures and microstructures on large glass substrates can be difficult and not cost-effective. Accordingly, a need exists for fabricating nanostructures and microstructures in a cost-effect manner on a continuous carrier film and then using the film to transfer or otherwise impart the structures onto glass substrates or other permanent receptor substrates.

SUMMARY

A first lamination transfer film, consistent with the present invention, can be used to transfer an open face structured layer. This transfer film includes a carrier substrate having a releasable surface, a sacrificial template layer applied to the releasable surface of the carrier substrate and having a non-planar structured surface, and a thermally stable backfill layer applied to the non-planar structured surface of the sacrificial template layer. The sacrificial template layer is capable of being removed from the backfill layer while leaving the structured surface of the backfill layer substantially intact.

A second lamination transfer film, consistent with the present invention, can be used to transfer an embedded structured layer. This transfer film includes a carrier substrate having a releasable surface, a sacrificial releasable layer applied to the releasable surface of the carrier substrate, a top layer applied to the sacrificial releasable layer, and a backfill layer applied to the top layer and forming a structured interface between the top and backfill layers. The sacrificial releasable layer is capable of being removed from the top layer while leaving the backfill layer and the top layer substantially intact.

A third lamination transfer film, consistent with the present invention, can be used to transfer a structured layer without using a carrier substrate. This transfer film includes a sacrificial polymer layer having a non-planar structured surface and a thermally stable backfill layer applied to the non-planar structured surface of the sacrificial polymer layer. The backfill layer has a structured surface corresponding with the non-planar structured surface of the sacrificial polymer layer. The sacrificial polymer layer is capable of being cleanly baked out while leaving the structured surface of the backfill layer substantially intact.

BRIEF DESCRIPTION OF THE DRAWINGS

The accompanying drawings are incorporated in and constitute a part of this specification and, together with the description, explain the advantages and principles of the invention. In the drawings.

DETAIL DESCRIPTION

Structured lamination transfer films and methods are described that enable the fabrication of structured solid surfaces using lamination and bake out steps. The methods involve thermoplastic replication (hot embossing) of a sacrificial film, layer, or coating in order to form a structured sacrificial layer, substantial planarization of the sacrificial layer with a thermally stable material, lamination of the coated film to a thermally stable receptor substrate, and pyrolysis or combustion of the sacrificial layer.

Figure 1:
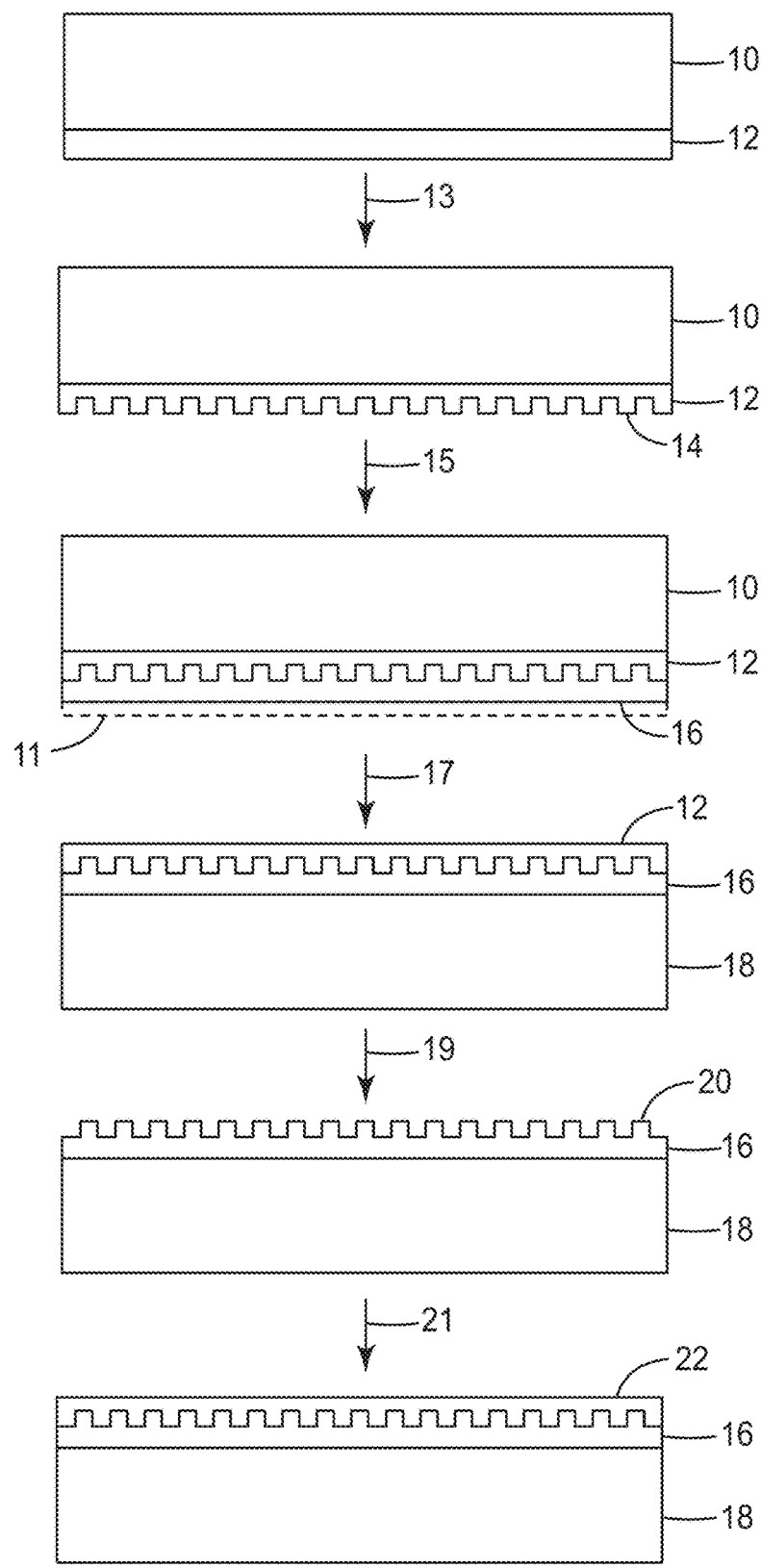
FIG. 1 is a diagram of a transfer film and method for transferring open face nanostructures to a receptor.

FIG. 1 is a diagram of a transfer film and method for transferring open face nanostructures to a receptor. This transfer film includes a liner (carrier substrate) 10 having a releasable surface and with a sacrificial template layer 12 on the releasable surface. The film is embossed to produce a structured surface 14 on sacrificial template layer 12 (step 13). The sacrificial template layer is substantially planarized using a backfill layer 16 (step 15). The film is laminated to a receptor substrate 18 and liner 10 is removed (step 17). As part of step 17, an optional adhesion promoting layer 11 can be applied to backfill layer 16 or to receptor substrate 18. Sacrificial template layer 12 is cleanly baked out or otherwise capable of being removed, leaving a structured surface 20 substantially intact on backfill layer 16 and corresponding with structured surface 14 (step 19). The structured layer can then be planarized with a planarization layer 22 (step 21).

Figure 2:
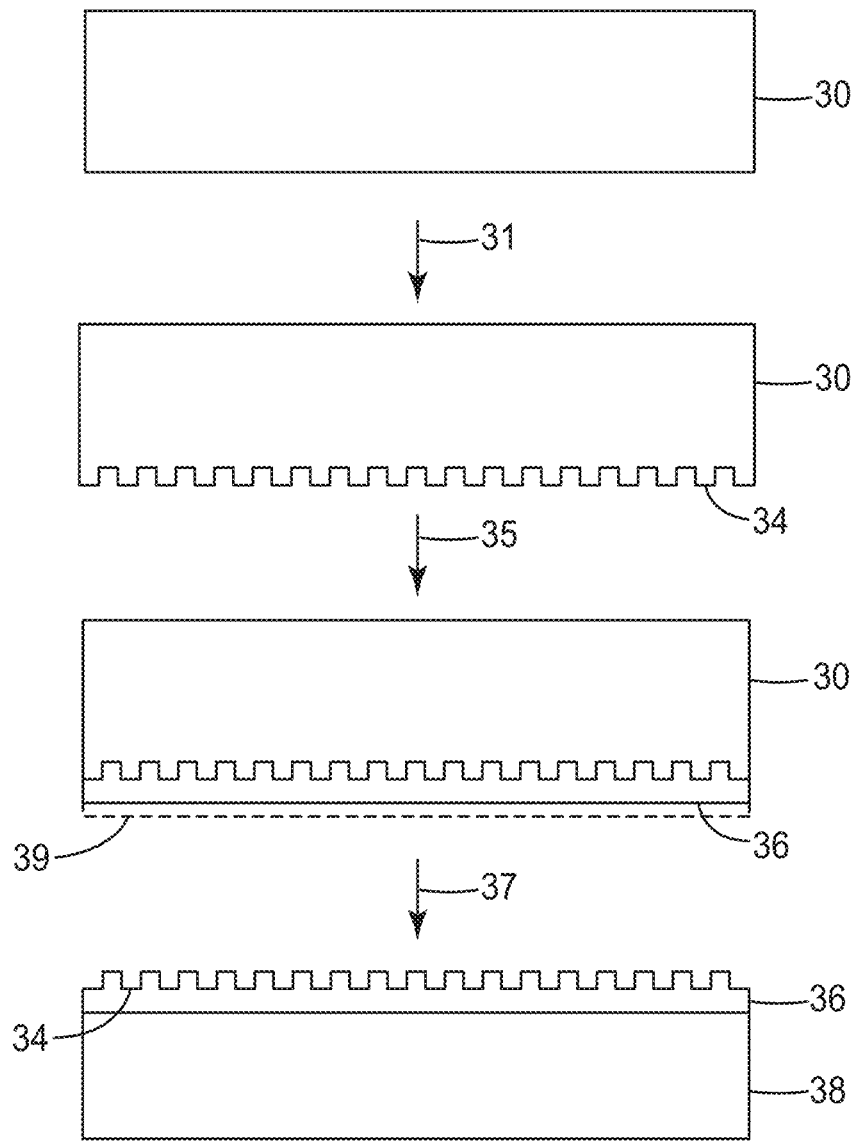
FIG. 2 is a diagram of a transfer film and method for transferring nanostructures to a receptor without use of a liner or carrier substrate.

FIG. 2 is a diagram of a transfer film and method for transferring nanostructures to a receptor without use of a liner or carrier substrate. This transfer film includes a sacrificial polymer layer 30, which is replicated to form a structured surface 34 (step 31). Structured surface 34 is substantially planarized using a backfill layer 36 (step 35). The film is laminated to a receptor substrate 38. As part of step 37, an optional adhesion promoting layer 39 can be applied to backfill layer 36 or to receptor substrate 38. Sacrificial polymer layer 30 is cleanly baked out, leaving structured surface 34 substantially intact on backfill layer 36 (step 37).

Figure 3:
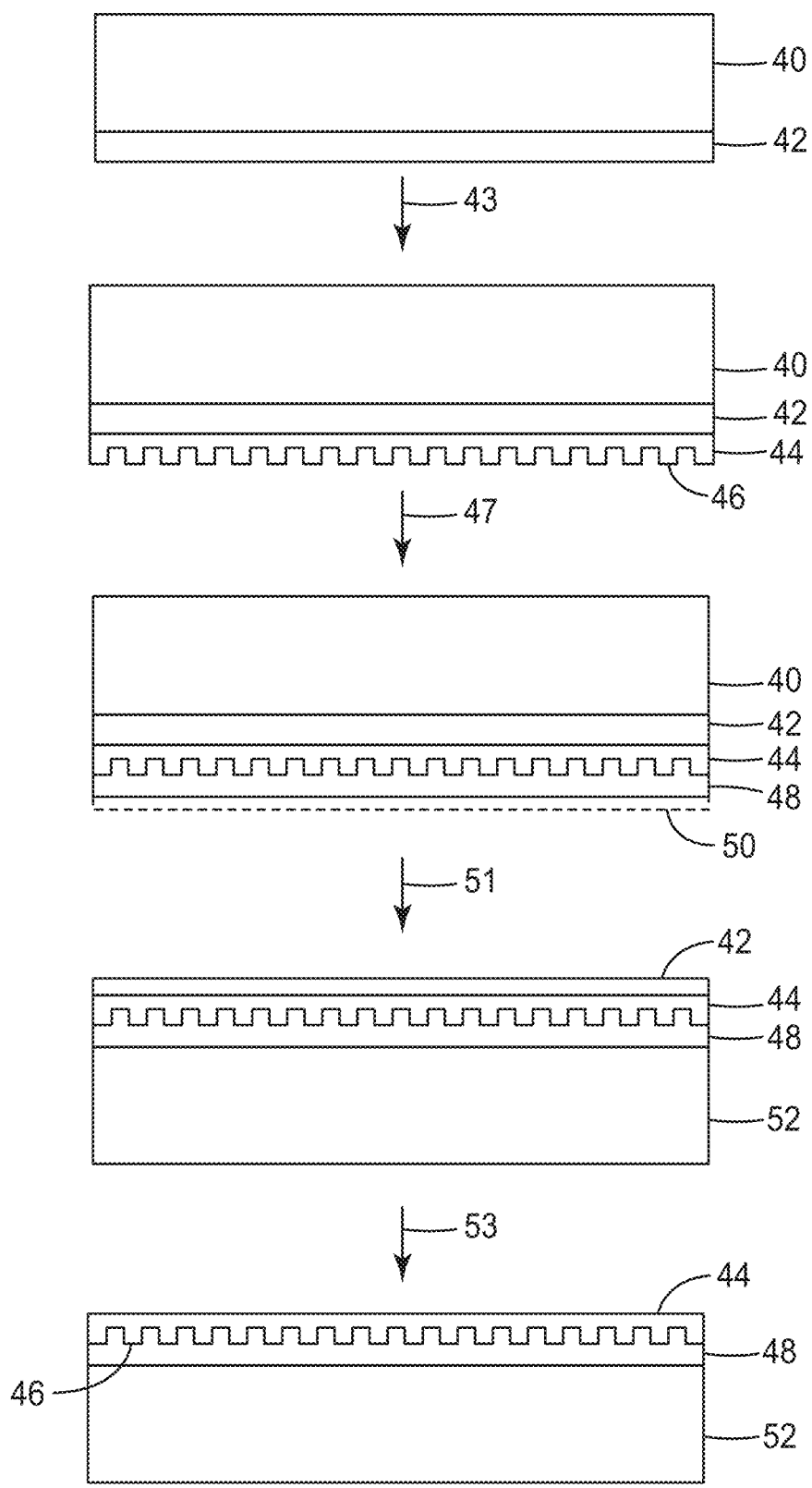
FIG. 3 is a diagram of a transfer film and method for transferring embedded nanostructures to a receptor.

FIG. 3 is a diagram of a transfer film and method for transferring embedded nanostructures to a receptor. This transfer film includes a liner (carrier substrate) 40 having a releasable surface and with a sacrificial releasable layer 42 on the releasable surface. The film is replicated with a top layer 44 having a structured surface 46 (step 43). Layer 44 is substantially planarized using a backfill layer 48 (step 47). As part of step 47, an optional adhesion promoting layer 50 can be applied to backfill layer 48 or to a receptor substrate 52. The film is laminated to receptor substrate 52 and liner 40 is removed, resulting in a cohesive or interfacial failure of sacrificial releasable layer 42 (step 51). The remaining portion of sacrificial releasable layer 42 on top layer 44 is cleanly baked out or otherwise capable of being removed, leaving structured surface 46 substantially intact between top layer 44 and backfill layer 48 (step 53).

The transfer films shown in FIGS. 1-3 can be used to transfer nanostructures onto active matrix OLED (AMO-LED) backplanes or OLED solid state lighting element substrates. These nanostructures can enhance light extraction from the OLED devices, alter the light distribution pattern of the devices, or both.

Figure 4:
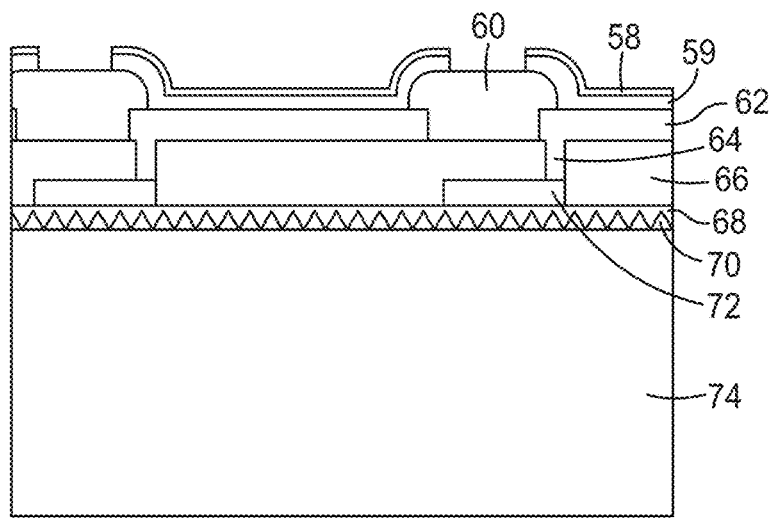
FIG. 4 is a diagram of a bottom emitting AMOLED with nanostructures on a glass substrate.

FIG. 4 is a diagram of a part of a bottom emitting AMOLED with nanostructures on a glass substrate. The AMOLED in FIG. 4 includes the following components arranged as shown: a top electrode 58; OLED layers 59; a pixel defining layer 60; a bottom electrode 62; a via 64; a high refractive index pixel circuit planarization layer 66; a high index structured planarizing layer 68; a low index structured layer 70; pixel circuitry 72; and a support 74 such as glass. The structured layers 70 and, optionally, 68 can be transferred during fabrication of an AMOLED backplane using one of the transfer films described above. Layer 66 can be implemented with a nanoparticle filled material where the nanoparticles are used to increase the refractive index of layer 66. Examples of polymers filled with high index inorganic materials (e.g., non-scattering nanoparticles having a size between 4 nm to 20 nm) are described in U.S. Pat. No. 6,329,058, which is incorporated herein by reference. By using such a nanoparticle filled material, layer 66 can have an index of refraction greater than 1.7, for example, or an index within exemplary ranges described herein.

Figure 5:
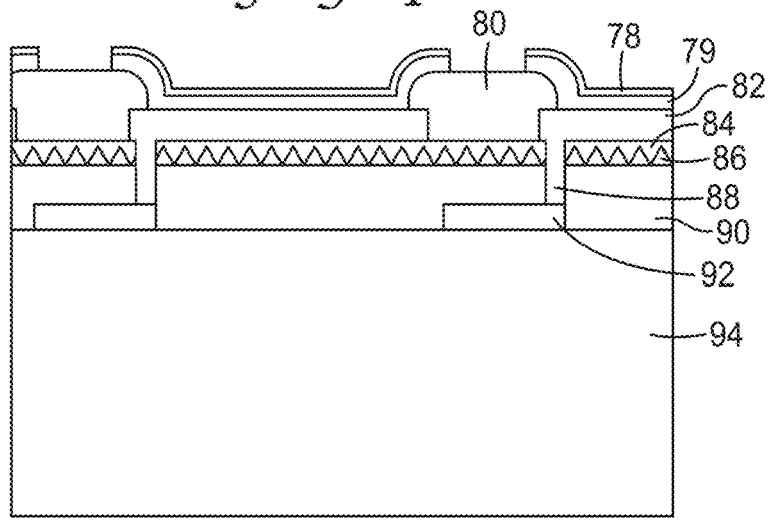
FIG. 5 is a diagram of a bottom emitting AMOLED with nanostructures on a planarizing layer.

FIG. 5 is a diagram of a part of a bottom emitting AMOLED with nanostructures on a planarizing layer. The AMOLED in FIG. 5 includes the following components arranged as shown: a top electrode 78; OLED layers 79; a pixel defining layer 80; a bottom electrode 82; a high index nanostructured planarizing layer 84; a low index nanostructured layer 86; a via 88; a pixel circuit planarization layer 90; pixel circuitry 92; and a support 94 such as glass. The nanostructured layers 86 and, optionally 84, can be transferred during fabrication of an AMOLED backplane using one of the transfer films described above. Planarization layer 84 is optional in that the material used for electrode 82 can be used to planarize nanostructured layer 86.

Figure 6:
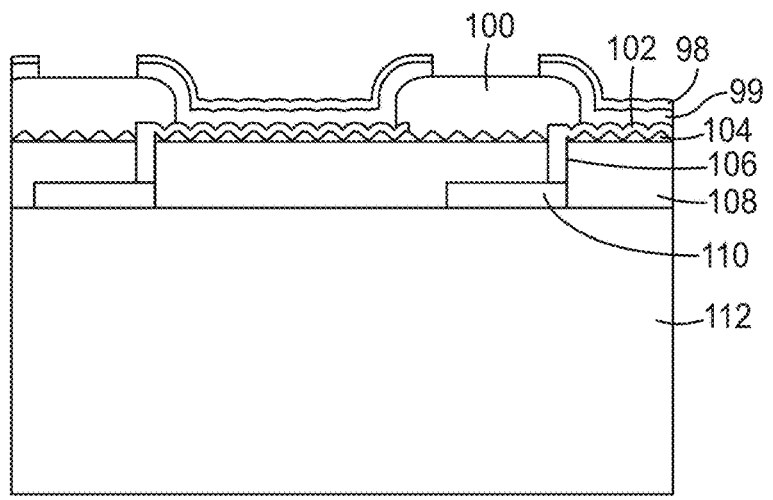
FIG. 6 is a diagram of a top emitting AMOLED with nanostructures on a planarizing layer.

FIG. 6 is a diagram of a part of a top emitting AMOLED with nanostructures on a planarizing layer. The AMOLED in FIG. 6 includes the following components arranged as shown: a transparent top electrode 98; OLED layers 99; a pixel defining layer 100; a reflective bottom electrode 102; a nanostructured layer 104; a via 106; a planarization layer 108; pixel circuitry 110; and a support 112 such as glass. The nanostructured layer 104 can be transferred during fabrication of an AMOLED backplane using one of the transfer films described above.

Figure 7:
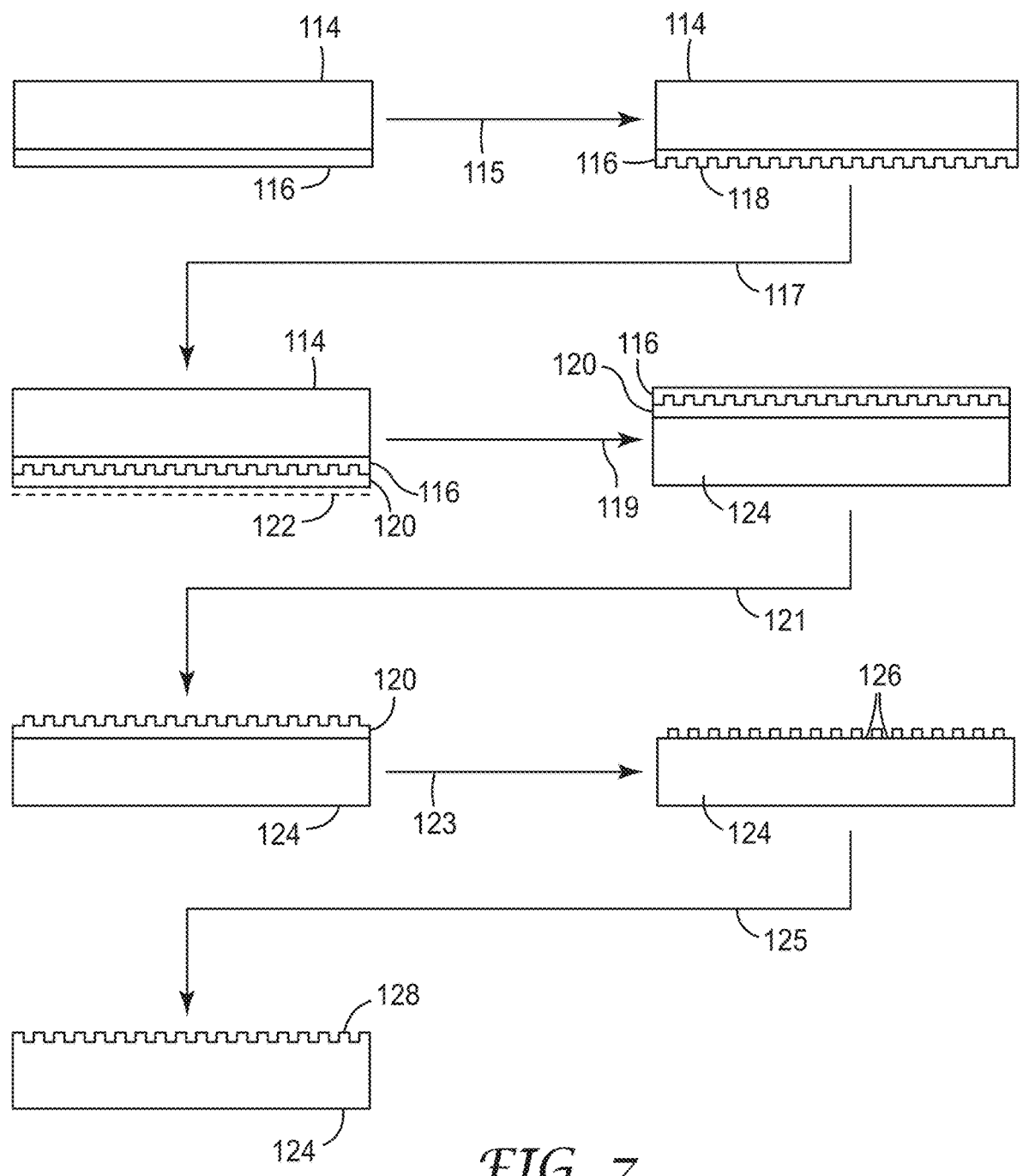
FIG. 7 is a diagram of a transfer film and method for transferring a nanostructured resist layer to a receptor substrate followed by etching of the substrate.

FIG. 7 is a diagram of a transfer film and method for transferring a nanostructured resist layer to a receptor substrate followed by etching of the substrate. This transfer film includes a liner (carrier substrate) 114 having a releasable surface and with a sacrificial template layer 116 on the releasable surface. The film is embossed to produce a structured surface 118 on sacrificial template layer 116 (step 115). The sacrificial template layer is planarized using a backfill layer 120 (step 117). The film is laminated to a receptor substrate 124 and liner 114 is removed (step 119). As part of step 119, an optional adhesion promoting layer 122 can be applied to backfill layer 120 or to receptor substrate 124. Sacrificial template layer 116 is cleanly baked out or otherwise capable of being removed, leaving a structured surface substantially intact on backfill layer 120 and corresponding with structured surface 118 (step 121). A breakthrough etch process is performed to remove portions of backfill layer 120 in areas 126 between the structures (step 123). A receptor substrate etch process is then performed, resulting in structured surface 128 on receptor substrate 124 (step 125). An optional strip step to remove residual resist on the structured receptor substrate is not depicted.

Figure 8:
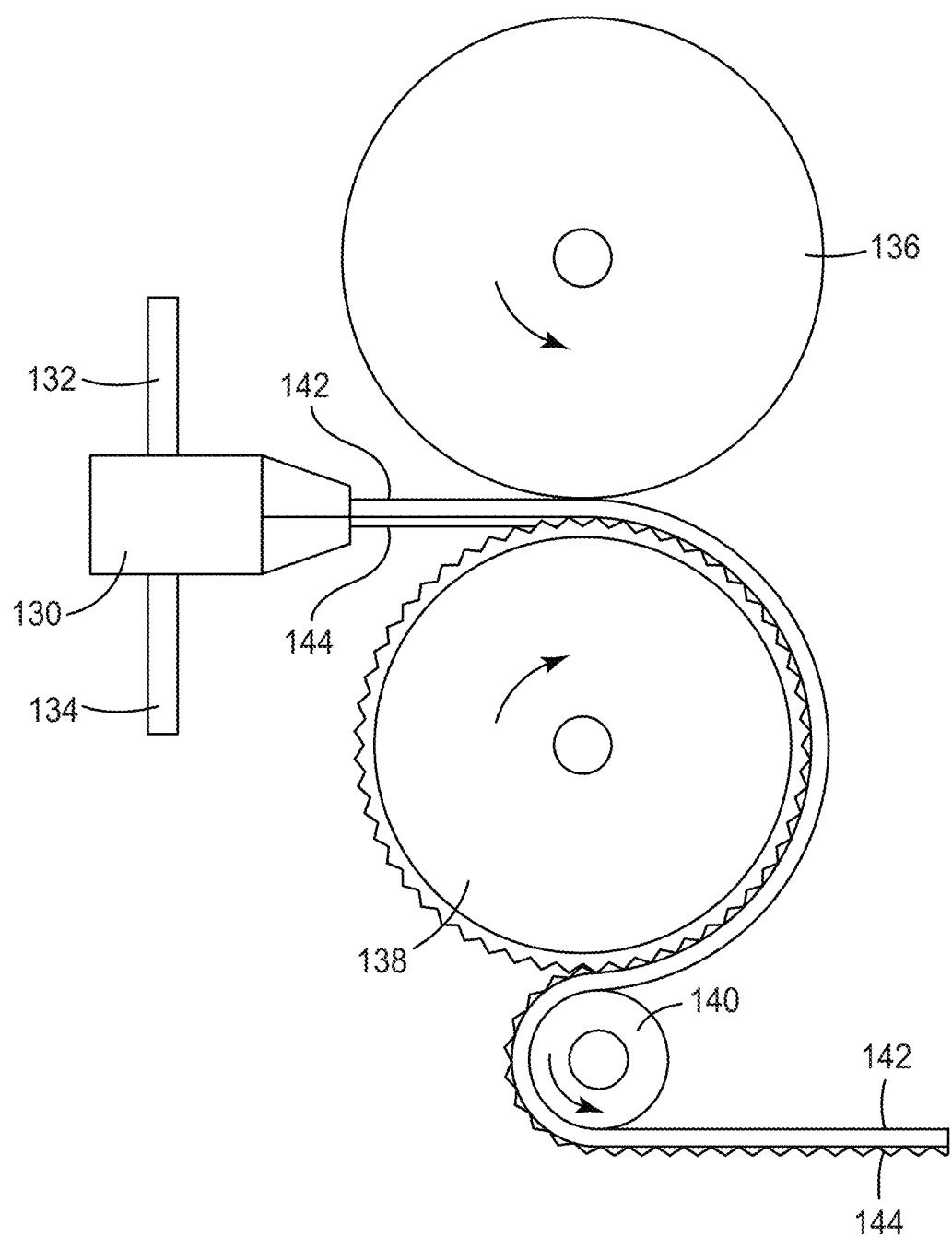
FIG. 8 is a diagram of a method of producing structured lamination transfer film via extrusion replication.

FIG. 8 is a diagram of a method of producing structured lamination transfer films via extrusion replication. In this method, an extrusion die 130 receives a carrier substrate (liner) material through feed tube 132 and a sacrificial template material through feed tube 134. The extruded material comprises carrier substrate layer 142 and sacrificial template layer 144. The extruded layers are fed between a nip roll 136 and a tooling roll 138, which imparts structure into sacrificial template layer 144. A strip off roll 140 is used to remove the transfer film from tooling roll 138. Methods for co-extrusion are described in U.S. Pat. No. 7,604,381, which is incorporated herein by reference as if fully set forth.

Figure 9A:
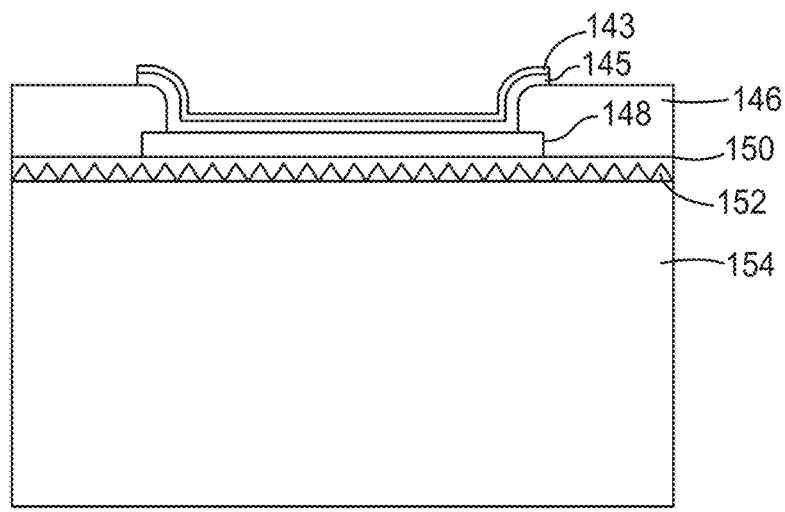
FIG. 9A is a diagram of a bottom emitting OLED solid state lighting device with nanostructures.
Figure 9B:
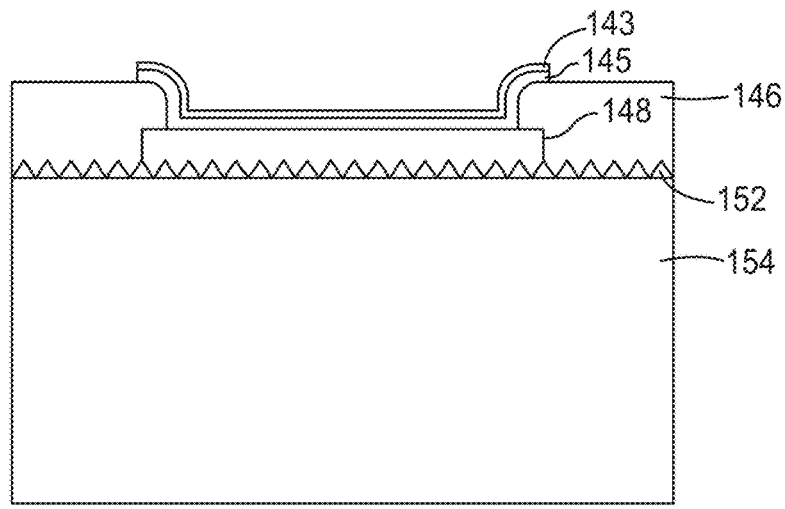
FIG. 9B is a diagram of a bottom emitting OLED solid state lighting device with nanostructures.

FIG. 9A is a diagram of a bottom emitting OLED solid state lighting device with nanostructures. The OLED device in FIG. 9 includes the following components arranged as shown: a top reflective electrode 143; OLED layers 145; a pixel defining layer 146; a transparent bottom electrode 148; a planarization layer 150; a structured backfill layer 152; and a substrate 154 such as glass. The structured backfill layer 152 can be transferred during fabrication of the OLED device using one of the transfer films described above. Transparent electrode 148 can be implemented with ITO, for example. Planarization layer 150 is optional in that the ITO material can be used to planarize backfill layer 152, as illustrated in FIG. 9B.

Figure 10:
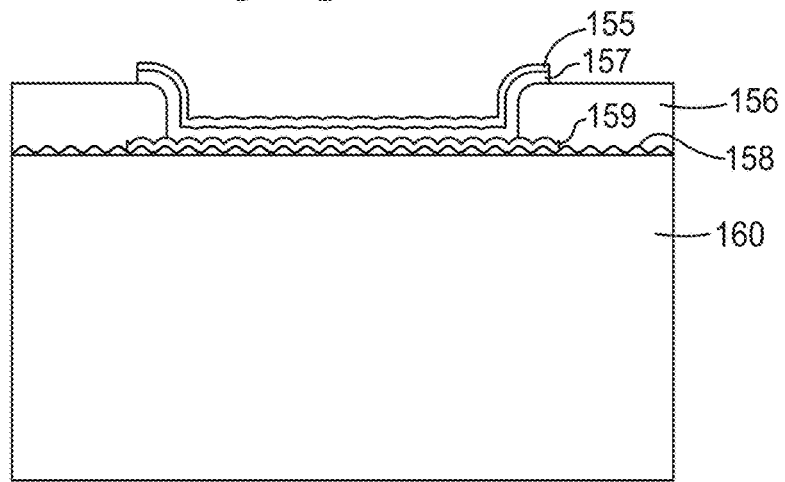
FIG. 10 is a diagram of a top emitting OLED solid state lighting device with nanostructures.

FIG. 10 is a diagram of a top emitting OLED solid state lighting device with nanostructures. The OLED device in FIG. 10 includes the following components arranged as shown: a transparent top electrode 155; OLED layers 157; an electrode defining layer 156; a bottom reflective electrode 159; a nanostructured layer 158; and a substrate 160 such as glass. The nanostructured layer 158 can be transferred during fabrication of the OLED device using one of the transfer films described above.

Figure 11:
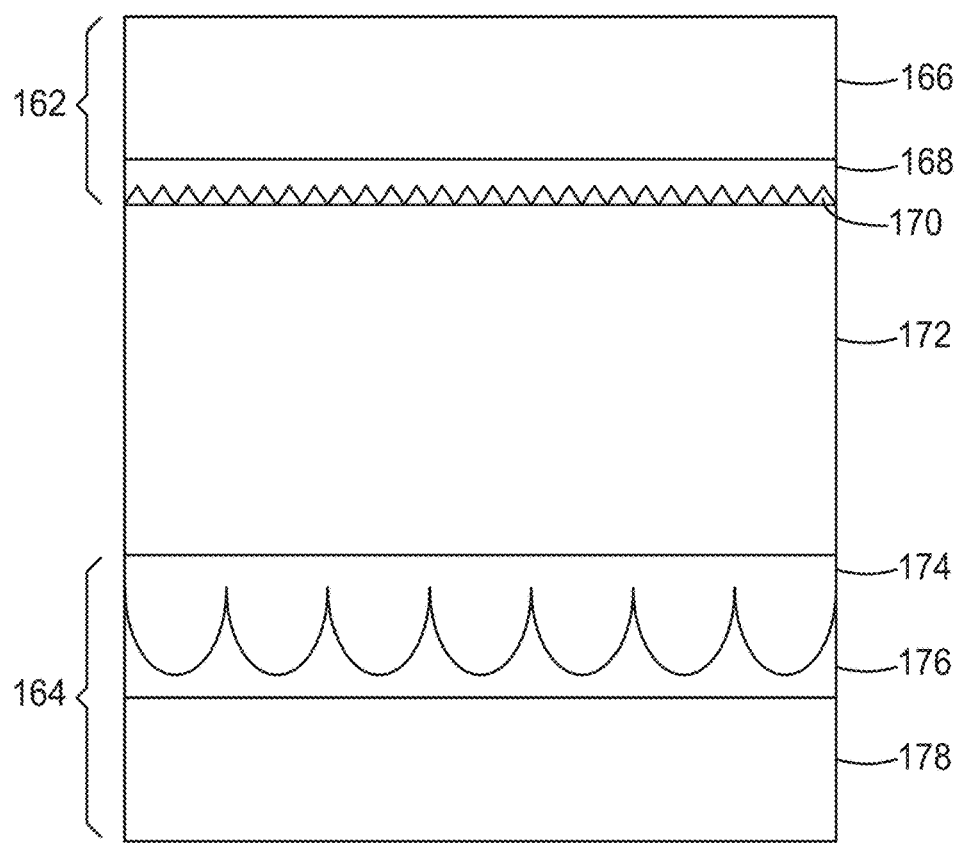
FIG. 11 is a diagram of a bottom emitting OLED solid state lighting substrate with lamination transfer films on both major surfaces.

FIG. 11 is a diagram of a bottom emitting OLED solid state lighting substrate with lamination transfer films on both major surfaces. The OLED device with transfer films in FIG. 11 includes a substrate 172, such as glass, having a first laminate 162 on one side and an optional second laminate 164 on the opposite side. First laminate 162 includes the following components arranged as shown: a carrier film 166; a sacrificial template layer 168; and a backfill layer 170. Second laminate 164 includes the following components arranged as shown: a carrier film 178; a sacrificial template layer 176; and a backfill layer 174.

Figure 12:
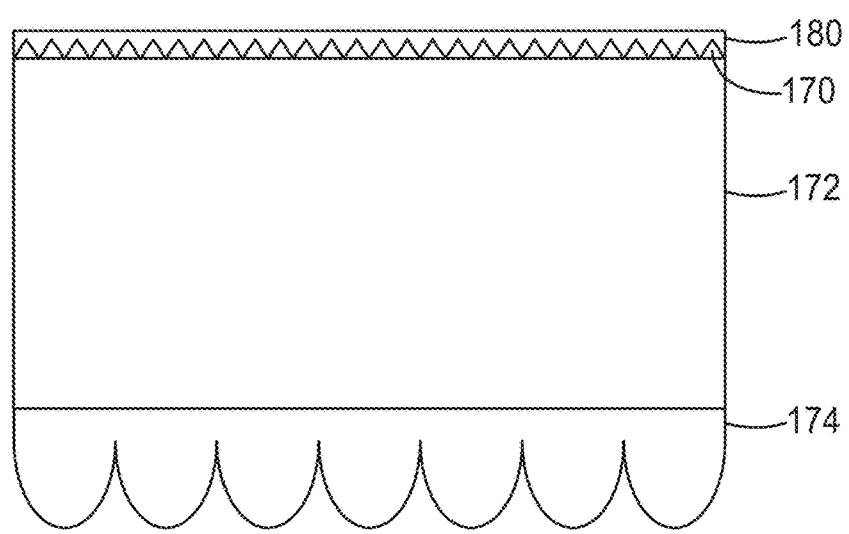
FIG. 12 is a diagram of a bottom emitting OLED solid state lighting substrate with structures on both major surfaces.

FIG. 12 is a diagram of the bottom emitting OLED solid state lighting substrate of FIG. 11 with structures on both major surfaces after removal of the carrier films 166 and 178 along with sacrificial template layers 168 and 176. These layers can be removed using the methods described above. After removal of sacrificial template layer 168, a planarization layer 180 can be applied over backfill layer 170.

Figure 13:
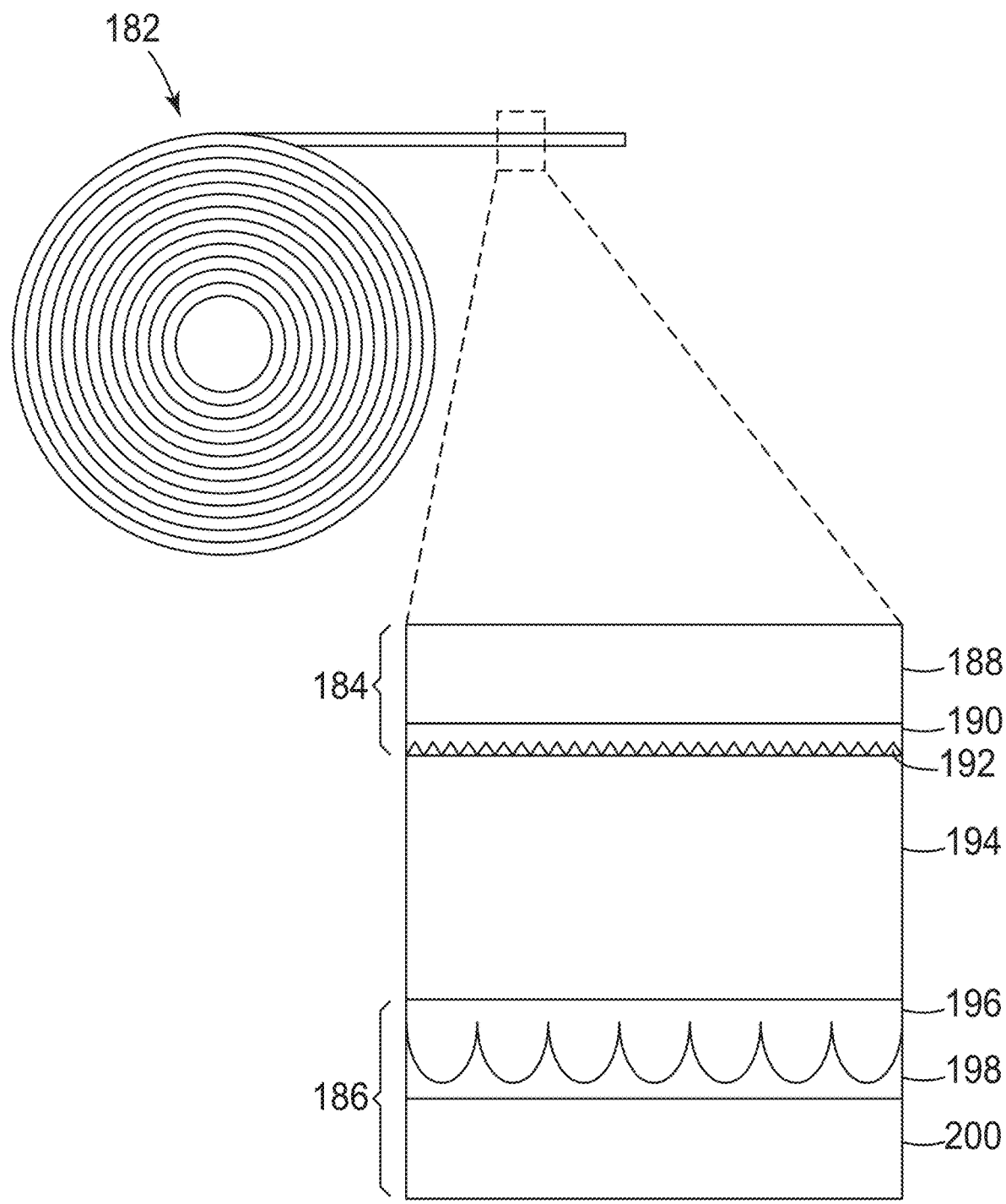
FIG. 13 is a diagram of a flexible glass lamination substrate assembly in roll form.

FIG. 13 is a diagram of a flexible glass lamination substrate assembly 182 in roll form. Assembly 182 includes a flexible substrate 194, such as flexible glass, having a first laminate 184 on one side and an optional second laminate 186 on the opposite side. First laminate 184 includes the following components arranged as shown: a carrier film 188; a sacrificial template layer 190; and a backfill layer 192. Second laminate 186 includes the following components arranged as shown: a carrier film 200; a sacrificial template layer 198; and a backfill layer 196.

Figure 14:
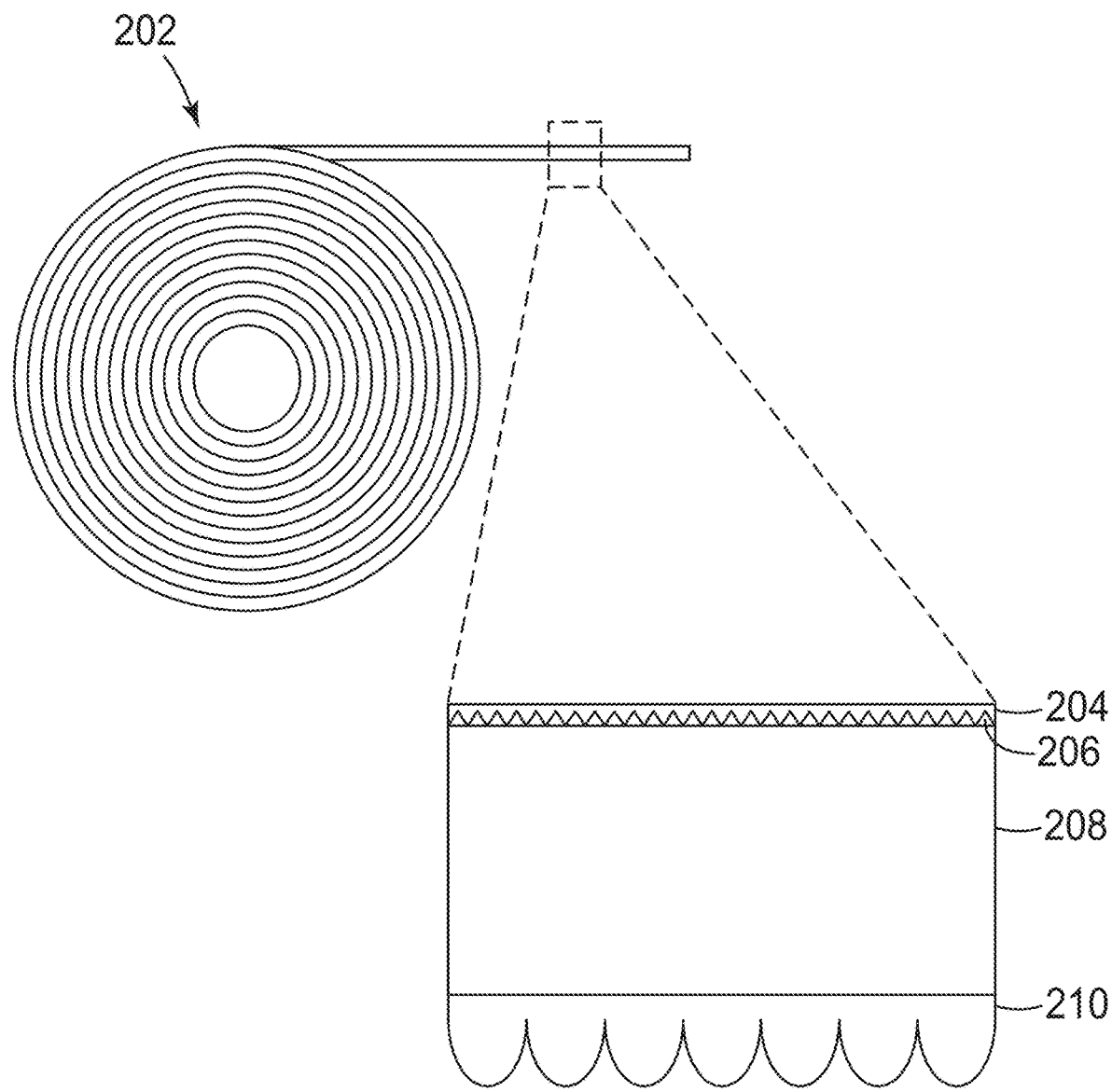
FIG. 14 is a diagram of a flexible glass substrate with structures on both major surfaces.

FIG. 14 is a diagram of a flexible glass substrate assembly 202 with structures on both major surfaces. Assembly 202 includes the following components arranged as shown: a planarization layer 204; a backfill layer 206; a flexible substrate 208 such as flexible glass; and a backfill layer 210. Assembly 202 can be generated by, for example, removal of the carrier films and sacrificial template layers of lamination assembly 182 of FIG. 13 using the methods described above, followed by application of planarization layer 204 and then returning the assembly to a roll form.

The substrates and assemblies shown in FIGS. 11-14 can include only internal structures, only external structures, or both internal and external structures.

Figure 15A:
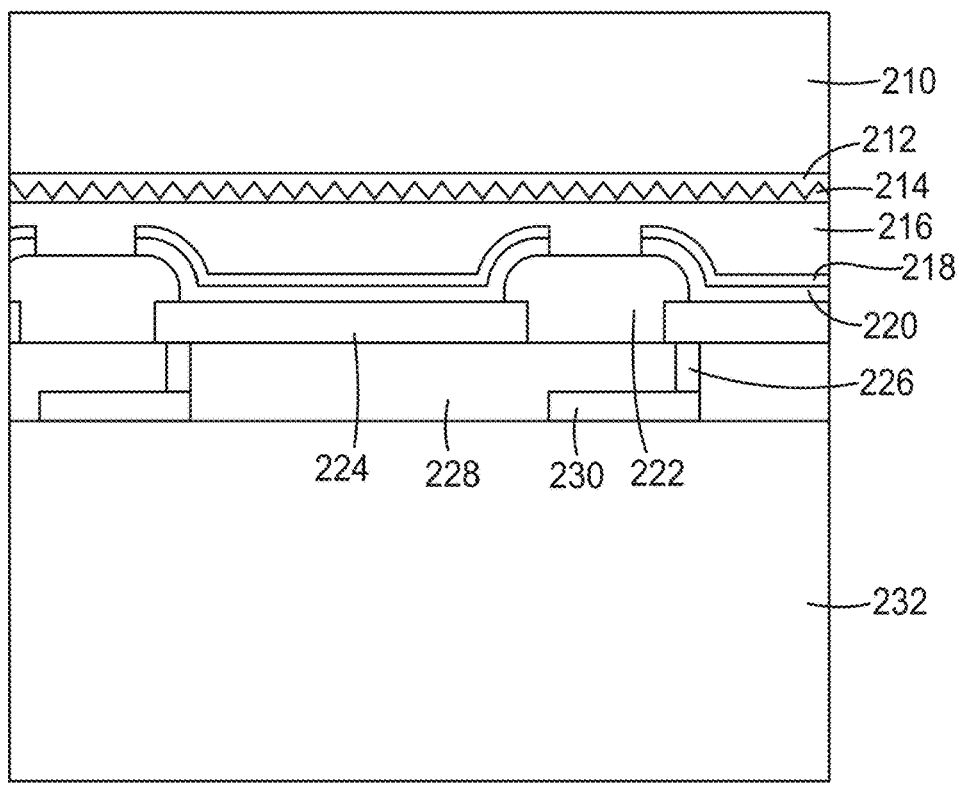
FIG. 15A is a diagram of a top emitting AMOLED with nanostructures on a glass substrate.

FIG. 15A is a diagram of a top emitting AMOLED with nanostructures on a glass substrate. Such nanostructures on glass are applied onto the top emitting AMOLED after backplane, OLED fabrication and cathode deposition processes are complete via a coupling adhesive with high refractive index. The OLED device in FIG. 15A includes the following components arranged as shown: a barrier substrate 210 such as glass; a backfill layer 212; an optional planarization layer 214; an optical coupling layer 216; a transparent top electrode 218; OLED layers 220; a pixel defining layer 222; a reflective bottom electrode 224; a via 226; a planarization layer 228; pixel circuitry 230; and a support substrate 232 such as glass.

Figure 15B:
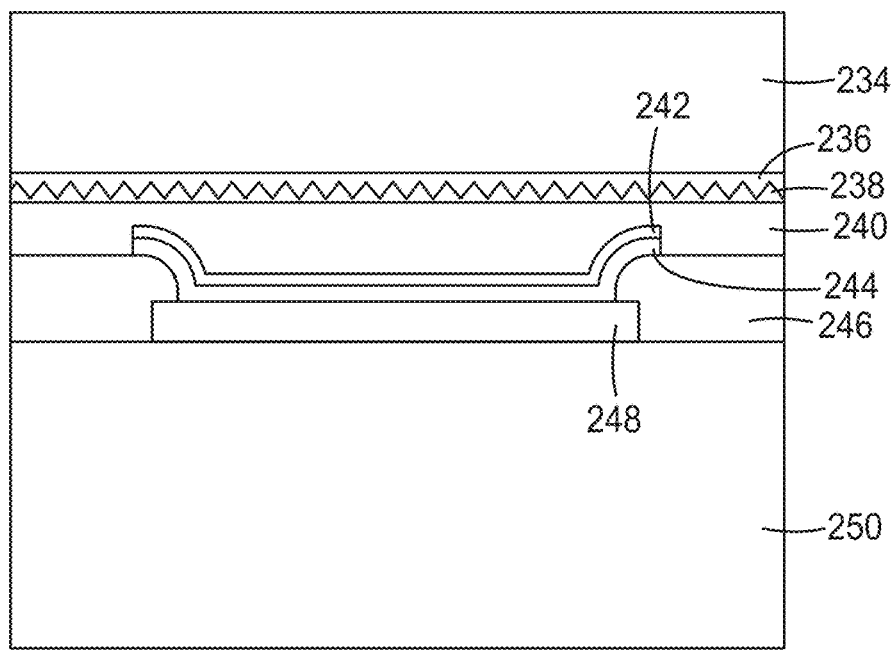
FIG. 15B is a diagram of a top emitting OLED solid state lighting device with nanostructures on a glass substrate.

FIG. 15B is a diagram of a top emitting OLED solid state lighting device with nanostructures on a glass substrate. The OLED device in FIG. 15B includes the following components arranged as shown: a barrier substrate 234 such as glass; a backfill layer 236; an optional planarization layer 238; an optical coupling layer 240; a transparent top electrode 242; OLED layers 244; an electrode defining layer 246; a reflective bottom electrode 248; and a support substrate 250 such as glass.

In AMOLEDs and OLED lighting displays and elements, the position and refractive index of each optically transparent layer is adjusted in order to optimize the performance of the device. Internal extraction structures are positioned within the device stack such that one or more of the layers below the structure have a refractive index that is index matched to the refractive index of the structured backfill layer, and one or more layers above the structure have a refractive index matched to the refractive index of the structured planarization layer.

FIGS. 4 and 5 illustrate two possible locations for the internal extraction structures within an AMOLED backplane. In FIG. 4, backfill layer 70 is positioned on top of glass substrate 74. The refractive index of the backfill layer is index matched to that of the glass substrate. Planarization layer 68 is positioned below the pixel circuit planarization layer 66 and bottom electrode 62. The refractive index of planarization layer 68, pixel circuit planarization layer 66, and bottom electrode 62 are all similar. In FIG. 5, the backfill layer is positioned on top of pixel circuit planarization layer 90. The refractive index of backfill layer 86 is index matched to that of pixel circuit planarization layer 90. Planarization layer 84 is positioned below bottom electrode 82. The refractive index of planarization layer 84 less than or equal to the refractive index of bottom electrode 82.

AMOLEDs in a top emission configuration have an additional loss mechanism attributed to surface plasmons in the metallic electrode at the bottom of the device. The loss may be mitigated by corrugation of the metallic electrode (S.-Y. Nien, et al., Appl. Phys. Lett. 93, 2009, 103304). FIG. 6 illustrates a top emitting AMOLED backplane designed to improve efficiency using a nanocorrugated cathode with a smooth, sinusoidal profile. The nanostructure is created using the lamination transfer process described herein. Open face nanostructure 104 is positioned on top of pixel circuit planarization layer 108. Thin metallic electrode 102 is deposited conformally (e.g., via vacuum evaporation) on open face nanostructure 104. The approach can also be applied to top emitting OLED solid state lighting elements. FIG. 6 illustrates such an element with a corrugated structure beneath the bottom electrode. For fully top emitting OLEDs or AMOLEDs, the corrugated nanostructure may be opaque. For partially top-emitting OLEDs or AMOLEDs, the nanostructure should be substantially transparent at the emission wavelength.

Another use of OLED internal extraction structures is the control or alter the light distribution pattern of the device. OLEDs lacking a microcavity in the OLED optical stack may be Lambertian emitters, with a light distribution pattern that is smooth and evenly distributed over a hemisphere. The light distribution pattern of commercially available AMOLED displays usually exhibit characteristics of a microcavity in the optical stack. These characteristics include a narrower and less uniform angular light distribution and significant angular color variation. For OLED displays, it may be desirable to tailor the light distribution with nanostructures using the methods described herein. The nanostructures may function to improve light extraction, to redistribute the emitted light, or both.

Structures can also be useful on the external surface of an OLED substrate to extract light into air that is trapped in substrate total internal reflection modes. External extraction structures can be microlens arrays, microfresnel arrays, or other refractive, diffractive, or hybrid optical elements.

In AMOLED applications, the optical characteristics of the transferred nanostructured layer and the optical characteristics of the layer(s) interfacing with the nanostructures and providing optical coupling of the nanostructures to AMOLED optical guided modes are critical. The materials need to be selected so that their respective refractive indexes ($n_1$, $n_2$), transmission spectra, and light scattering characteristics over the spectral range of interest provide the desired optical effect. For example, it may be desirable for the nanostructure and all layers interfacing with the nanostructure and the AMOLED to be optically transparent (% T>90). It may also be desired that refractive indexes $n_1$ and $n_2$ are substantially different in order to produce a desired optical effect. For example, the index mismatch (difference between $n_1$ and $n_2$, referred to as $\Delta n$) is preferably greater than or equal to 0.3, 0.4, 0.5, or 1.0. When the index mismatch is used for enhancing light extraction, a greater mismatch tends to provide greater light extraction and is thus preferred, as described in U.S. Pat. No. 8,179,034, which is incorporated herein by reference as if fully set forth.

In one example, the refractive index of the transferred nanostructure $n_1$ can index match that of the substrate onto which the nanostructure is applied ($n_1 \approx 1.5$), while refractive indices of the layers interfacing with the nanostructure and coupling it to the OLED stack are in the range of refractive index values typically shown by OLED stack materials ($n_2 \approx 1.7$–$2.0$).

In other examples, the value of $\Delta n$ can be considered and designed for particular applications with $\Delta n$ preferably in the range of 0.1 to 1.5.

In yet other examples, the value of the ratio of $n_1$ to $n_2$ ($n_1/n_2$) can be considered and designed for particular applications with $n_1/n_2$ preferably in the range of 1.05 to 1.9.

The term "index matched" means that $\Delta n$ is preferably less than 0.1, or less than 0.01 or 0.001, depending upon the desired application.

Furthermore, the transferred layer can provide an optical, mechanical, or physical function. For example, the transferred layer can act as a physical resist or reactive ion etch mask in a process to directly etch a glass or wafer receptor substrate. In this case, the lamination transfer process is followed by a breakthrough etch to remove the residual layer (also called the "land") and a wet chemical or dry etch of the glass, as described below.

In a typical wet chemical etching process, the substrate with patterned photoresist is immersed in chemicals that selectively degrade the substrate. On silicon-containing substrates, this chemical is usually hydrofluoric acid (HF) buffered with ammonium fluoride ($NH_4F$), because the highly reactive fluoride ion degrades silicon faster than the polymers typically used as photoresists. After the etch and removal of the photoresist with sulfuric acid, an inverse replica of the patterned photoresist is left behind on the substrate.

In a standard dry etching process, high-energy ion plasmas are accelerated towards the substrate using an electromagnetic field in a process known as reactive ion etching (RIE). The highly energetic ions can chemically react and volatilize the polymer film, and can also transfer their kinetic energy to physically remove material via a sputtering mechanism. RIE processes produce more anisotropic etch profiles than wet chemical etchants due to the directional nature of ion bombardment in RIE.

The etch rate of polymers in an oxygen plasma RIE process depends critically on the carbon and oxygen content in a polymer. The so called "Ohnishi parameter" quantifies the etch rate ($R_{etch}$), as given by $R_{etch} \propto N/N_C - N_O$ where $N$ is equal to the total number of atoms in a monomer unit, $N_C$ the number of carbon atoms in the monomer, and $N_O$ the number of oxygen atoms in the monomer. Therefore, generally speaking, a photoresist with high carbon content acts as a better etch mask than does a photoresist with high oxygen content under oxygen plasma RIE. Lamination transfer nanostructures with a high Ohnishi parameter would be desirable for dry etch patterning processes.

Generally speaking, the lower the Ohnishi Parameter, the higher the etch resistance. For example, a high carbon content polymer, such as poly(hydroxy-styrene), has an $R_{etch} \approx 2.5$, while an oxygen-containing polymer such as poly(methylmethacrylate) has an $R_{etch}$ value $\approx 5.0$. $R_{etch}$ values of less than 2.5 are highly desirable for the creation of patterns etch mask materials. The carbon ring structure present in poly(hydroxystyrene) also contributes to its high etch resistance.

It is also possible to incorporate other elements into the patterned transfer layer, such as silicon and iron, which can be converted into their respective oxides when exposed to oxygen plasma RIE. After the formation of the oxide layer, their etch rate is determined by the competition between the oxide growth and oxide removal by ion sputtering. These oxides can etch as much as forty times slower than typical organic polymers under oxygen plasmas. In order to etch silicon-containing substrates, an RIE etch with fluorinated gases such as $SF_6$, $CF_4$, or $CHF_3/Ar$ are typically used, which often degrades both the substrate and the oxide-containing resist at approximately the same rate. This limits the etch depth and the subsequent creation of high-aspect ratio patterned features in the substrate. Therefore, a facile method to deposit high-aspect ratio silicon-containing materials is highly desirable for pattern transfer using dry etching processes.

Using the lamination transfer process, it is possible to use the planarized backfill inside the nanostructured sacrificial template layer as a lithographic etch mask. The sacrificial template layer etches much faster than the backfill layer under oxygen plasma, since most thermoplastics are organic polymers with a high Ohnishi parameter. The polypropylene carbonate-based material identified in the Examples has an Ohnishi parameter of around 13, for example, and the corresponding backfill can be a glass-like material. Thus, once the lamination transfer is complete, the sacrificial polymer template may be removed cleanly with a dry etching process using an oxygen plasma. The silicon-containing etch mask should remain largely unaffected by this process or will convert to silicon oxides. Finally, if so desired, a pattern can be created in the substrate by continuing the etching process after all the sacrificial polymer has been removed, using the same or different etch gas chemistry. Pattern transfer into the substrate can continue until all of the transferred silicon-containing etch mask is destroyed to create a high-aspect ratio nanostructure. The pattern etched into the substrate will be equivalent to that of the original nanostructured sacrificial template layer.

Applications of Lamination Transfer Films

The lamination transfer films described herein can be used for a variety of purposes. For example, the lamination transfer films can be used to transfer structured layers in OLED devices as described above.

Another exemplary application of the lamination transfer films is for patterning of free space digital optical elements including microfresnel lenses, diffractive optical elements, holographic optical elements, and other digital optics described in Chapter 2 of B. C. Kress, P. Meyrueis, Applied Digital Optics, Wiley, 2009, on either the internal or external surfaces of display glass, photovoltaic glass elements, LED wafers, silicon wafers, sapphire wafers, architectural glass, or other high temperature stable substrates, meaning the substrate is stable over the temperature range required to remove the sacrificial layer.

The lamination transfer films can also be used to produce decorative effects on glass surfaces. For example, it might be desirable to impart iridescence to the surface of a decorative crystal facet. In particular, the glass structures can be used in both functional and decorative applications such as transportation glasses, architectural glasses, glass tableware, artwork, display signage, tableware, and jewelry or other accessories. Also, a coating can be applied over these glass structures. This optional coating can be relatively thin in order to avoid adversely affecting the glass structure properties. Examples of such coatings include hydrophilic coatings, hydrophobic coatings, protective coatings, anti-reflection coatings and the like.

Materials

Four main classes of materials are required for the fabrication of the structured transfer films for the patterning of solid optical surfaces: carrier films, receptor substrates, thermally stable backfill and planarization materials of tunable refractive index, and sacrificial materials which are thermoplastic or photoactive polymers which decompose with low ash.

Carrier Films

The liner or carrier substrate can be implemented with a thermally stable flexible film providing mechanical support for the other layers. The liner has a releasable surface, meaning the liner allows for release of a material applied to the releasable surface. The carrier substrate should be thermally stable above 70° C., or alternatively above 120° C., without adversely affecting either the sacrificial layer or the backfill layer. One example of a carrier film is polyethylene terephthalate (PET).

Receptor Substrates

Examples of receptor substrates include glass such as display mother glass, lighting mother glass, architectural glass, roll glass, and flexible glass. An example of flexible roll glass is the WILLOW glass product from Corning Incorporated. Other examples of receptor substrates includes metals such as metal sheets and foils. Yet other examples of receptor substrates include sapphire, silicon, silica, and silicon carbide.

Another example of a receptor substrate includes semiconductor materials on a support wafer. The dimensions of these receptor substrates exceed those of a semiconductor wafer master template. Currently, the largest wafers in production have a diameter of 300 mm. Lamination transfer films produced using the method described herein can be made with a lateral dimension of greater than 1000 mm and a roll length of hundreds of meters. The large dimensions are possible by using a combination of roll-to-roll processing and a cylindrical master template. Films with these dimensions can be used to impart nanostructures over entire large digital displays (e.g., a 55 inch diagonal AMOLED HDTV, with dimensions of 52 inches wide by 31.4 inches tall).

The receptor substrate can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98 and T-K. Kim et al., Mat. Res. Soc. Symp. Proc. Vol. 448 (1997) 419-23, both of which are incorporated herein by reference as if fully set forth.

A particular advantage of the transfer process described herein is the ability to impart structure to receptor surfaces with large surfaces, such as display mother glass or architectural glass. The dimensions of these receptor substrates exceed those of a semiconductor wafer master template. The large dimensions of the lamination transfer films are possible by using a combination of roll-to-roll processing and a cylindrical master template.

Sacrificial Materials

The sacrificial layer is a material capable of being baked out or otherwise removed while leaving the adjacent layer, including structured surfaces, substantially intact. The adjacent layer includes, for example, a backfill layer having a structured surface or two layers having a structured surface between them. The sacrificial layer includes, for example, the sacrificial template layer, sacrificial releasable layer, sacrificial polymer layer, or sacrificial parting layer, depending upon a construction of the transfer film.

The structured surface of the sacrificial layer can be formed through embossing, a replication process, extrusion, casting, or surface structuring, for example. The structured surface can include nanostructures, microstructures, or hierarchical structures. Nanostructures comprise features having at least one dimension (e.g., height, width, or length) less than or equal to two microns. Microstructures comprise features having at least one dimension (e.g., height, width, or length) less than or equal to one millimeter. Hierarchical structures are combinations of nanostructures and microstructures.

Materials that may be used for the sacrificial layer (sacrificial template layer, sacrificial releasable layer, sacrificial polymer layer, or sacrificial parting layer) include, polyvinyl alcohol (PVA), ethylcellulose, methylcellulose, polynorbornes, poly(methylmethacrylate (PMMA), poly(vinylbutyral), poly(cyclohexene carbonate), poly(cyclohexene propylene) carbonate, poly(ethylene carbonate) poly(propylene carbonate) and other aliphatic polycarbonates, and other materials described in chapter 2, section 2.4 "Binders" of R. E. Mistler, E. R. Twiname, Tape Casting: Theory and Practice, American Ceramic Society, 2000. There are many commercial sources for these materials, a few of which are included in Table 1 below. These materials are typically easy to remove via dissolution or thermal decomposition via pyrolysis or combustion. Thermal heating is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The material should be capable of being coated onto a substrate via extrusion, knife coating, solvent coating, cast and cure, or other typical coating methods. It is preferred that the material be a solid at room temperature but have a $T_g$ that is low enough to allow it to be embossed by a heated tool. Thus, it is preferred that the sacrificial material have a $T_g$ above 25° C., more preferred above 40° C. and most preferred above 90° C. A sacrificial material capable of being embossed is also a preferred material property.

Another material property that is desired for the sacrificial material is that its decomposition temperature be above the curing temperature of the backfill material(s). Once the backfill material is cured, the structure is permanently formed and the sacrificial template layer can be removed via any one of the methods listed above. Materials that thermally decompose with low ash or low total residue are preferred over those that have higher residuals. Residue left behind on a substrate may adversely impact optical properties such as the transparency or color of the final product. Since it is desirable to minimizing any changes to these properties in the final product, residual levels of less than 1000 ppm are preferred. Residuals levels of less than 500 ppm are more preferred and residual level below 50 ppm are most preferred.

The term "cleanly baked out" means that the sacrificial layer can be removed by pyrolysis or combustion without leaving a substantial amount of residual material such as ash. Examples of preferred residual levels are provided above, although different residual levels can be used depending upon a particular application.

TABLE 1

Sacrificial Materials

| Material Name or Trade Designation | Type | Available from |
|---|---|---|
| Ethocel | Ethylcellulose | Dow Chemical (Midland, MI) |
| Fiberlease P.V.A | Polyvinyl alcohol | Fiberlay Inc (Seattle, WA) |
| Partall Film #10 | Polyvinyl alcohol | Rexco (Conyers, GA) |
| ASR Series | Polynorbornenes | Promerus (Cleveland, OH) |
| Novomer PPC | Polypropylene carbonate | Novomer Inc (Ithaca, NY) |
| QPAC Series | Aliphatic polycarbonates | Empower Materials (New Castle, DE) |

Backfill and Planarization Materials

The backfill layer is a material capable of substantially planarizing the adjacent layer (e.g., the sacrificial layer) while also conforming to the structured surface of the adjacent layer. The backfill layer can alternatively be a bilayer of two different materials where the bilayer has a multi-layer structure or where one of the materials is at least partially embedded in the other material. The two materials for the bilayer can optionally have different indices of refraction. One of the bilayers can optionally comprise an adhesion promoting layer.

Substantial planarization means that the amount of planarization (P %), as defined by equation 1, is preferably greater than 50%, more preferably greater than 75%, and most preferably greater than 90%. The following is equation 1: $P\% = (1-(t_1/h_1))*100$ where $t_1$ is the relief height of a surface layer and $h_1$ is the feature height of features covered by the surface layer, as further described in P. Chiniwalla, IEEE Trans. Adv. Packaging 24(1), 2001, 41.

Materials that may be used for the thermally stable backfill include polysiloxane resins, polysilazanes, polyimides, silsesquioxanes of bridge or ladder-type, silicones, and silicone hybrid materials and many others. These molecules typically have an inorganic core which leads to high thermal stability, mechanical strength, and chemical resistance, and an organic shell that helps with solubility and reactivity. There are many commercial sources of these materials, which are summarized in Table 2 below. Other classes of materials that may be of use are benzocyclobutenes, soluble polyimides, and polysilazane resins, for example.

Different varieties of the above materials can be synthesized with higher refractive index by incorporating nanoparticles or metal oxide precursors in with the polymer resin. Silecs SC850 material is a modified silsesquioxane (n≈1.85) and Brewer Science high index polyimide OptiNDEX D1 material (n≈1.8) are examples in this category. Other materials include a copolymer of methyltrimethoxysilane (MTMS) and bistriethoxysilylethane (BTSE) (Ro et. al, Adv. Mater. 2007, 19, 705-710). This synthesis forms readily soluble polymers with very small, bridged cyclic cages of silsesquioxane. This flexible structure leads to increased packing density and mechanical strength of the coating. The ratio of these copolymers can be tuned for very low coefficient of thermal expansion, low porosity and high modulus.

The thermally stable backfill material preferably meets several requirements. First, it should adhere and conform to the structured surface on which it is coated. This means that the viscosity of the coating solution should be low enough to be able to flow into very small features without the entrapment of air bubbles, which will lead to good fidelity of the replicated structure. It should be coated with a solvent that does not dissolve or swell the underlying sacrificial mold, which would cause cracking of the backfill upon dry. It is desirable that the solvent has a boiling point below that of the sacrificial mold glass transition temperature. Preferably, isopropanol, butyl alcohol and other alcoholic solvents have been used. Second, the material should cure with sufficient mechanical integrity (e.g., "green strength") at temperatures below the glass transition temperature of the sacrificial template layer. If the backfill material does not have enough green strength at low temperatures, both the sacrificial mold and the backfill pattern features will slump and replication fidelity will degrade. Third, the refractive index of the cured material should index match that of the glass substrate, approximately 1.5, depending on the type of glass used in the process, either borosilicate or quartz. Other substrates of a different index can also be used for this process, such as sapphire, nitride, metal, polyimide, or oxide. Fourth, the backfill material should be thermally stable (e.g., showing minimal cracking, blistering, or popping) above the temperature at which the sacrificial mold starts to decompose, in addition to the upper range of the process steps used to make OLED display backplanes. Typically the materials used for this layer undergo a condensation curing step, which causes shrinkage and the build-up of compressive stresses within the coating. There are a few materials strategies which are used to minimize the formation of these residual stresses which have been put to use in several commercial coatings which satisfy all of the above criteria.

It can be advantageous to adjust the refractive index of both the backfill and planarization layers. For example, in OLED light extraction applications, the nanostructure imparted by the lamination transfer film is located at a structured interface of the backfill and planarization layers. The backfill layer has a first side at the structured interface and a second side coincident with an adjacent layer. The planarization layer has a first side at the structured interface and a second side coincident with an adjacent layer. In this application, the refractive index of the backfill layer is index matched to the adjacent layer to the backfill layer opposite the structured interface, while the refractive index of the planarization layer is index matched to the adjacent layer to the planarization layer opposite the structured interface.

Nanoparticles can be used to adjust refractive index of the backfill and planarization layers. For example, in acrylic coatings, silica nanoparticles (n≈1.42) can be used to decrease refractive index, while zirconia nanoparticles (n≈2.1) can be used to increase the refractive index. If the index difference is large between the nanoparticles and binder, a haze will develop inside the bulk of the coating. For applications in which low haze is a desirable attribute (e.g., tuned light distribution of AMOLEDs using diffractive optical elements), there is a limit to both the refractive index difference and the concentration of nanoparticles before haze develops. For applications in which haze is a desirable attribute (e.g. uniform light distribution in OLED solid state lighting elements), this limit can be exceeded. There is also a limit to the concentration of nanoparticles in the resin before particle aggregation begins to occur, thereby limiting the extent to which refractive index of the coating can be tuned.

TABLE 2

Thermally stable mold materials of both low and high refractive index

| Material Name or Trade Designation | Type | Available from |
|---|---|---|
| TecheGlas GRx resins | T-resin (methyl silsesquioxane) | TechneGlas (Perrysburg, Ohio) |
| HSG-510 | T-resin (methyl silsesquioxane) | Hitachi Chemical (Tokyo, Japan) |
| ACCUGLASS 211 | T-Q resin (methyl silsesquioxane) | Honeywell (Tempe, AZ) |
| Hardsil AM | silica nanocomposite | Gelest Inc (Morrisville, PA) |
| MTMS-BTSE Copolymer (Ro et. al, Adv. Mater. 2007, 19, 705-710) | bridged silsesquioxane | National Institute of Standards and Technology (Gaithersburg, MD) |
| PermaNew6000 | silica-filled methyl-polysiloxane polymer containing a latent heat-cure catalyst system | California Hardcoat (Chula Vista, CA) |
| FOX Flowable OXide | Hydrogen Silsesquioxane | Dow Corning (Midland, MI) |
| Ormocer, Ormoclad, Ormocore | silicone hybrid | Micro Resist GmBH (Berlin, Germany) |
| Silecs SCx resins | silicone hybrid (n = 1.85) | Silecs Oy (Espoo, Finland) |
| OptiNDEX D1 | soluble polyimide (n = 1.8) | Brewer Science (Rolla, MO) |
| Corin XLS resins | soluble polyimide | NeXolve Corp. (Huntsville, AL) |
| Ceraset resins | polysilazanes | KiON Specialty Polymers (Charlotte, NC) |
| Bolton metals | low melting metal | Bolton Metal Products (Bellafonte, PA) |
| CYCLOTENE resins | benzocyclobutane polymers | Dow Chemical (Midland, MI) |

Adhesion Promoting Layer Materials

The adhesion promoting layer can be implemented with any material enhancing adhesion of the transfer film to the receptor substrate without substantially adversely affecting the performance of the transfer film. The exemplary materials for the backfill and planarization layers can also be used for the adhesion promoting layer. A preferred material for the adhesion promoting layer is the CYCLOTENE resin identified in Table 2.

EXAMPLES

All parts, percentages, ratios, etc. in the examples are by weight, unless noted otherwise. Solvents and other reagents used were obtained from Sigma-Aldrich Corp., St. Louis, Mo. unless specified differently. Table 3 lists the materials for the Examples.

TABLE 3

Materials

| Abbreviation or Trade Designation | Description | Available from |
|---|---|---|
| ACCUGLASS 211 | T-Q resin (methyl silsesquioxane) | Honeywell (Tempe, AZ) |
| AP3000 | adhesion promoter | Dow Chemical Company, Midland, MI |
| BTSE | bis(triethoxysilylethyl) ethane | VWR International, LLC, Radnor, PA |
| CYCLOTENE 3022 | CYCLOTENE 3022-63 resin, 63% w/w stock | Dow Chemical Company, Midland, MI |
| HCl | hydrochloric acid | VWR International, LLC, Radnor, PA |
| MTMS | methyltrimethoxysilane | VWR International, LLC, Radnor, PA |
| PermaNew6000 | T-Resin Nanocomposite | California Hardcoat (Chula Vista, CA) |
| QPAC 40 | poly(alkylene carbonate) copolymer | Empower Materials, Inc., New Castle, DE |
| QPAC 100 | poly(alkylene carbonate) copolymer | Empower Materials, Inc., New Castle, DE |
| QPAC 130 | poly(alkylene carbonate) copolymer | Empower Materials, Inc., New Castle, DE |
| T50 | Siliconized PET release liner | Solutia Inc, St Louis, MO |
| THF | anhydrous tetrahydrofuran | Sigma-Aldrich Corp., St. Louis, MO |
| PDM 1086 | Polynorbornene | Promerus (Cleveland, OH) |

Example 1 (QPAC 100/Honeywell Material/Cyclotene)

Sacrificial Material Layer Coating and Embossing

A 5 wt % solution of QPAC 100 in 1,3-dioxolane was delivered at a rate of 30 cm$^3$/min to a 10.2 cm (4 inch) wide slot-type coating die in continuous film coating apparatus. The solution was coated on the backside of a 0.051 mm (0.002 inch) thick T50 siliconized PET release liner. The coated web traveled approximately 2.4 m (8 ft) before entering a 9.1 m (30 ft) conventional air floatation drier with all 3 zones set at 65.5° C. (150° F.). The substrate was moving at a speed of 3.05 m/min (10 ft/min) to achieve a wet coating thickness of about 80 micrometers.

The coated film was then embossed in a nip under a pressure of 1.75 kN/cm (1000 pounds per lineal inch) with the sacrificial coating against a metal master tool with 600 nm pitch linear sawtooth grooves at a temperature of 110° C. (230° F.). Embossing line speed was 0.61 m/min (2 ft/min).
Backfill Layer Coating ACCUGLASS 211 spin-on glass was brought to room temperature and then applied to the embossed film sample by spin coating. A glass microscope slide was used to support the film during the coating process. The spin parameters were 500 rpm/5 sec (solution application), 2000 rpm/15 sec (spin down), and 1000 rpm/20 sec (dry).

The sample was removed from spin coater and placed on a hotplate at 90° C. for 5 min to complete the drying process.
Adhesion Promotion Layer Coating CYCLOTENE 3022 (Dow Chemical, Midland Mich.) was diluted to 32 wt % with mesitylene and then spin coated onto the backfill coating surface of the sample. A glass microscope slide was used to support the film during the coating process. The spin parameters were 500 rpm/5 sec (solution application), 3000 rpm/15 sec (spin down), and 1000 rpm/20 sec (dry).

The sample was removed from spin coater and placed on a hotplate at 90° C. for 5 min to complete the drying process.

Lamination to Primed Glass

Polished glass slides, 50 mm×50 mm×0.7 mm, were cleaned with a lint free cloth, treated in an ultrasonic wash chamber for 20 min with detergent, and then placed for 20 minutes each in two cascading rinse chambers with heated water. The slides were then dried for 20 minutes in an oven with circulating air.

The glass surface was treated with Dow AP3000 to improve adhesion of CYCLOTENE 3022 during the lamination step. Dow AP3000 was applied by spin coating. The spin parameters were 500 rpm/5 sec (solution application), 3000 rpm/15 sec (spin down), and 1000 rpm/20 sec (dry).

The sample was removed from spin coater and placed on a hotplate at 90° C. for 5 min to complete the drying process.

The CYCLOTENE 3022 coated sample was laminated, coating side down, to the treated glass slide on the hotplate using a silicone hand roller.

Sacrificial Template Layer Removal

The T50 siliconized PET release liner was removed and then the laminated sample was placed in a tube furnace at room temperature. The furnace was purged with nitrogen gas for the duration of the experiment. The temperature was then ramped from 25° C. to 425° C. at 3° C./min and held at 425° C. for 1 h. The furnace and sample cooled to ambient temperature. The resulting nanostructured sample was transparent and exhibited iridescence that is characteristic of a linear optical grating.

Example 2 (QPAC 100/80:20/Cyclotene)

A carrier film coated with QPAC 100 was prepared on T50 siliconized PET release liner and embossed as in Example 1.

Backfill Layer Coating

A backfill coating solution was created using two different silane monomers, MTMS and BTSE. HCl (0.148 g of 37% HCl in $H_2O$) and distilled water (8.9 g $H_2O$) were added drop-wise into a mixture of MTMS and BTSE (5.7 mL MTMS and 3.7 mL BTSE) while stirring at 0° C. The molar ratio R1, defined as (mole of HCl)/(mole of MTMS+BTSE), was 0.03 and the molar ratio R2, defined as (mole of $H_2O$)/(mole of MTMS+BTSE), was 10.0. The molar ratio MTMS:BTSE was 8:2. Anhydrous tetrahydrofuran (THF) was used as the reaction solvent, with approximately 35% by mass of the monomer mixture added to the THF. After addition of the water/acid, the mixture was slowly heated to 60° C. and magnetically stirred for 4 hours in a dry, inert atmosphere under reflux. The reaction mixture was allowed to cool to room temperature for approximately 30 minutes, filtered through a 0.45 micron filter, and then shaken with methyl t-butyl/ether and water in a separatory funnel. After shaking, the water phase was discarded, and more water was added. This washing step was repeated three more times, for a total of four washing steps. The ether phase was collected in a round-bottom flask, and magnesium sulfate was added until the solution turned clear. The suspension was stirred magnetically for 30 minutes to remove any trace of water and then filtered again through a 0.45 micron filter. The ether was evaporated under reduced pressure and the resulting white solid dried under vacuum overnight. The yield of material was about 2 g, or approximately 20%. The compound was shown to be readily soluble in both isopropyl alcohol (IPA) and sec-butanol. The backfill coating solution was made by diluting the compound in IPA to 5% w/w.

The backfill coating solution described above was applied to the embossed film sample by spin coating. A glass microscope slide was used to support the film during the coating process. The spin parameters were 500 rpm/5 sec (solution application), 2000 rpm/15 sec (spin down), and 1000 rpm/20 sec (dry).

The sample was removed from spin coater and placed on a hotplate at 90° C. for 5 min to complete the drying process.

Adhesion Promotion Layer Coating

A portion of the backfilled sample was coated with the CYCLOTENE 3022 product as described in Example 1.

Lamination to Glass

Polished glass slides, 50 mm×50 mm×0.7 mm, were cleaned with a lint free cloth, treated in an ultrasonic wash chamber for 20 min with detergent, and then placed for 20 minutes each in two cascading rinse chambers with heated water. The slides were then dried for 20 minutes in an oven with circulating air.

The coated sample was laminated, coating side down, to the cleaned glass slide on the hotplate using a silicone hand roller.

Sacrificial Template Layer Removal

Figure 16:
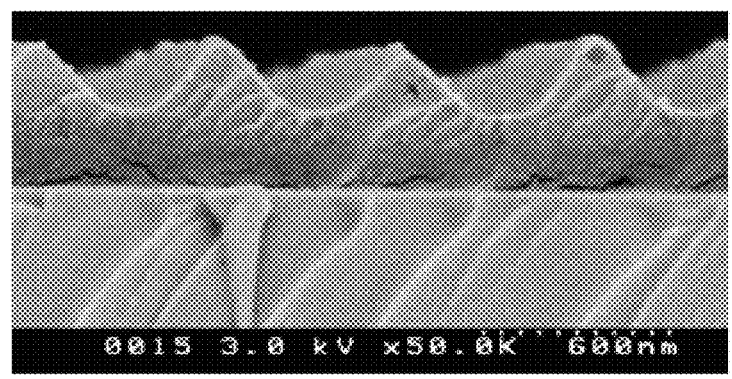
FIG. 16 is a side sectional image of a nanostructured glass surface from Example 2.

The T50 siliconized PET release liner was removed and the laminated sample was placed in a box furnace (Lindberg Blue M box furnace model BF51732PC-1, Asheville N.C., USA). The temperature was increased from 25° C. to 430° C. at a rate of approximately 1° C./min. The furnace was held at 430° C. for 1 h, then the furnace and sample were allowed to cool to ambient temperature. The resulting nanostructured sample was transparent and exhibited iridescence that is characteristic of a linear optical grating. FIG. 16 is a side sectional image of the resulting nanostructured glass surface.

Comparative Example C1 (QPAC 100/Cyclotene, No Nanostructure)

Sacrificial Material Layer Coating and Embossing

A coated film was prepared on T50 siliconized PET release liner and embossed as in Example 1.

Backfill Layer Coating

In this example, CYCLOTENE 3022 is the sole backfill material. A section of film with coated and embossed QPAC 100 was coated with the CYCLOTENE 3022 product as described in Example 1.

Lamination to Glass

The sample was then laminated to a polished glass slide as described in Example 2.

Sacrificial Template Layer Removal

The T50 siliconized PET release liner was removed and then the laminated sample was placed in a box furnace (Lindberg Blue M box furnace model BF51732PC-1, Asheville N.C., USA) and brought from 25° C. to 450° C. at a rate of approximately 3.5° C./min. The furnace was held at 430° C. for 1 h and was then allowed to cool to ambient temperature. The resulting nanostructured sample was transparent and exhibited iridescence that is characteristic of a linear optical grating Example 3 (QPAC 100/PermaNew 6000/Cyclotene)

Sacrificial Material Layer Coating and Embossing

A coated film was prepared on T50 siliconized PET release liner and embossed as in Example 1.

Backfill Layer Coating

A section of the embossed film was treated with an air corona in a roll to roll process using a dual ceramic bar apparatus powered by a Universal Compak power supply (Enercon Industries Corporation, Menomonee Falls, Wis.). The system was configured to apply 0.75 J to the sample at 1.5 m/min (5 ft/min) in air, with a 3.2 mm (⅛ inch) gap between the ceramic bar and the sample.

A sample of the corona treated embossed film (≈2 in×3 in) was coated with PermaNew 6000, which was applied to the embossed film sample by spin coating. A glass microscope slide was used to support the film during the coating process. The spin parameters were 500 rpm/5 sec (solution application), 2000 rpm/15 sec (spin down), and 1000 rpm/20 sec (dry).

The sample was removed from spin coater and placed on a hotplate at 90° C. for 5 min to complete the drying process.
Adhesion Promotion Layer Coating A portion of the backfilled sample was coated with the CYCLOTENE 3022 product as described in Example 1.
Lamination to Glass The sample was then laminated to a polished glass slide as described in Example 2.
Sacrificial Template Layer Removal The T50 siliconized PET release liner was removed and then the laminated sample was placed in a box furnace (Lindberg Blue M box furnace model BF51732PC-1, Asheville N.C., USA) and brought from 25° C. to 130° C. at a rate of approximately 1° C./min. The furnace was held at 130° C. for two hours to cure the backfill. Then, the temperature was raised to 400° C. and held for one hour to decompose the sacrificial material. The furnace and sample were allowed to cool down to ambient temperature. The result was a transparent glass substrate having nanostructures.

Example 4 (QPAC 130/PermaNew 6000/Cyclotene)

QPAC 130 (5 wt % in chloroform) was hand coated on the back side of a 0.051 mm (0.002 inch) thick T50 siliconized PET release liner using a notch bar coater. The coating was dried in a solvent oven at 70° C. for 30 min.

A release coating was applied to a polymer tool having 600 nm pitch linear grooves by depositing a silicon containing layer by plasma deposition using a Plasma-Therm batch reactor (Plasma-Therm Model 3032 available from Plasma-Therm, St. Petersberg, Fla.). The coated film was embossed on the sacrificial material side in a nip under a pressure of 552 kPa (80 psi) against the polymer tool at a temperature of 143° C. (290° F.). Embossing line speed was approximately 0.3 m/min (1 foot per minute). The polymer tool was removed from the coated film to form a film with an embossed structure.
Backfill Layer Coating A sample of the embossed film (≈2 in×3 in) was adhered to a 1 mm thick 5.1 cm×7.6 cm (2 inch×3 inch) glass microscope slide (available from VWR International, Radnor Pa.) with a drop of water. The sample was put on a Model WS-6505-6npp/liter spin coater (available from Laurell Technologies Corporation, North Wales Pa.) directly on the vacuum chuck. A vacuum of 64 kPa (19 inches of Hg) was applied to hold the sample to the chuck. The spin coater was programmed for 500 RPM for 5 seconds (coating application step) then 2000 RPM for 15 sec (spin step), then 1000 RPM for 20 seconds (dry step).

PermaNew 6000 was diluted to a final concentration of 10 wt % with isopropyl alcohol. A sample of the embossed film (≈2 in×3 in) was coated with the diluted PermaNew 6000, which was applied to the embossed film sample by spin coating. A glass microscope slide was used to support the film during the coating process. The spin parameters were 500 rpm/5 sec (solution application), 2000 rpm/15 sec (spin down), and 1000 rpm/20 sec (dry).

The sample was removed from spin coater and placed on a hotplate at 90° C. for 5 min to complete the drying process.
Adhesion Promotion Layer Coating A piece of the backfilled sample was coated with the CYCLOTENE 3022 product as in Example 1.
Lamination to Glass Polished glass slides, 50 mm×50 mm×0.7 mm, were cleaned with a lint free cloth, treated in an ultrasonic wash chamber for 20 min with detergent, and then placed for 20 minutes each in two cascading rinse chambers with heated water. The slides were then dried for 20 minutes in an oven with circulating air.

Figure 17:
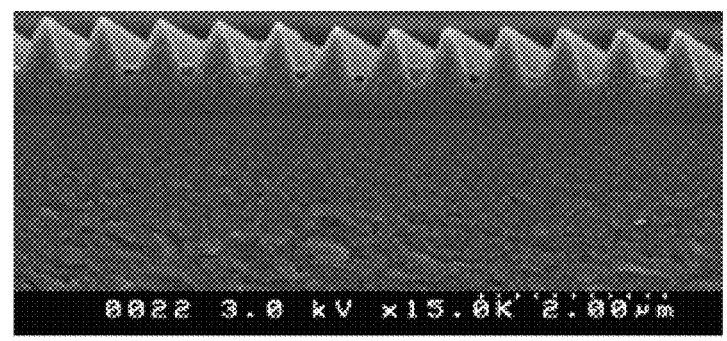
FIG. 17 is a side sectional image of a nanostructured glass surface from Example 4.

The coated sample was laminated on a hotplate heated to 110° C., coating side down, to the cleaned glass slide on the hotplate using a silicone hand roller.
Sacrificial Template Layer Removal The T50 siliconized PET release liner was removed and then the laminated sample was placed in a box furnace as in Example 3. The furnace and sample were allowed to cool down to ambient temperature. The result, shown in the side sectional image of FIG. 17, was a transparent glass substrate having nanostructures.

Comparative Example C2 (QPAC 40/Cyclotene, No Nanostructure)

QPAC 40 (25 wt % in 2-butanone) was hand coated on the back side of a 0.051 mm (0.002 inch) thick T50 siliconized PET release liner using a notch bar coater with the gap set to 201 microns. The coating was dried in a solvent oven at 70° C. for 30 min.

A release coating was applied to a polymer tool having 600 nm pitch linear grooves by depositing a silicon containing layer by plasma deposition using a Plasma-Therm batch reactor (Plasma-Therm Model 3032 available from Plasma-Therm, St. Petersberg, Fla.). The coated film was embossed on the sacrificial material side in a nip under a pressure of 552 kPa (80 psi) against the polymer tool at a temperature of 66° C. (150° F.). Embossing line speed was approximately 0.3 m/min (1 foot per minute). The polymer tool was removed from the coated film to form a film with an embossed structure.
Adhesion Promotion Layer Coating CYCLOTENE 3022 (Dow Chemical, Midland Mich.) was diluted to 32 wt % with mesitylene and then spin coated onto the backfill coating surface of the sample. A glass microscope slide was used to support the film during the coating process. The spin parameters were 500 rpm/5 sec (solution application), 2000 rpm/15 sec (spin down), and 1000 rpm/20 sec (dry).

The sample was removed from spin coater and placed on a hotplate at 35° C. for 10 min to complete the drying process.
Lamination to Glass Polished glass slides, 50 mm×50 mm×0.7 mm, were cleaned with a lint free cloth, treated in an ultrasonic wash chamber for 20 min with detergent, and then placed for 20 minutes each in two cascading rinse chambers with heated water. The slides were then dried for 20 minutes in an oven with circulating air.

The coated sample was laminated on a hotplate heated to 35° C., coating side down, to the cleaned glass slide on the hotplate using a silicone hand roller.
Sacrificial Template Layer Removal The T50 siliconized PET release liner was removed and then the laminated sample was placed in a box furnace (Lindberg Blue M box furnace model BF51732PC-1, Asheville N.C., USA) and brought from 25° C. to 450° C. at a rate of approximately 3.5° C./min. The furnace was held at 450° C. for one hour and then allowed to cool. The result was a transparent glass substrate without nanostructures.

Example 5 (QPAC 100/PermaNew 6000/Cyclotene, No Liner)

QPAC 100 (5 wt % in 1,3-dioxolane) was hand coated on the back side of a 0.051 mm (0.002 inch) thick T50 siliconized PET release liner using a notch bar coater with the gap set to 300 microns. The coating was dried in a solvent oven at 70° C. for 120 min.

A release coating was applied to a polymer tool having 600 nm pitch linear grooves by depositing a silicon containing layer by plasma deposition using a Plasma-Therm batch reactor (Plasma-Therm Model 3032 available from Plasma-Therm, St. Petersberg, Fla.). The coated film was embossed in a nip under a pressure of 552 kPa (80 psi) against the polymer tool at a temperature of 66° C. (150° F.). Embossing line speed was approximately 0.3 m/min (1 foot per minute). The polymer tool was removed from the coated film to form a film with an embossed structure.

The carrier was then removed from the sacrificial material to form a freestanding replicated film.
Backfill Layer Coating A piece of the embossed film was backfilled with the PermaNew 6000 product as described in Example 3.
Adhesion Promotion Layer Coating CYCLOTENE 3022 (Dow Chemical, Midland Mich.) was diluted to 32 wt % with mesitylene and then spin coated onto the backfill coating surface of the sample. A glass microscope slide was used to support the film during the coating process. The spin parameters were 500 rpm/5 sec (solution application), 3000 rpm/15 sec (spin down), and 1000 rpm/20 sec (dry).

The sample was removed from spin coater and placed on a hotplate at 90° C. for 5 min to complete the drying process.
Lamination to Glass Polished glass slides, 50 mm×50 mm, were first cleaned with a lint free cloth, then sonicated in a wash chamber for 20 minutes with detergent, and then placed for 20 minutes each in two cascading rinse chambers with heated water. The slides were then dried for 20 minutes in an oven with circulating air.

Figure 18:
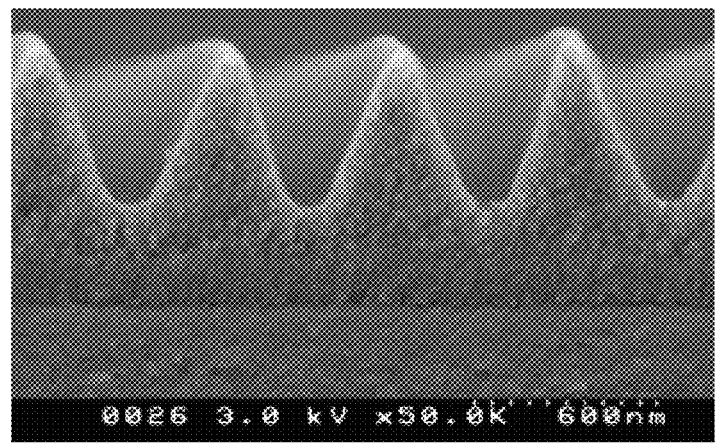
FIG. 18 is a side sectional image of a nanostructured glass surface from Example 5.

A dried slide was then put on a hot plate at 90° C. for 5 minutes, covered with an aluminum tray. The CYCLOTENE 3022 coated sample was laminated, coating side down, to the glass slide while still on the hotplate using a silicone hand roller with a piece of T50 siliconized PET release liner between the sample and the roller to keep the sample from sticking to the roller.
Sacrificial Template Layer Removal The T50 siliconized PET release liner was removed and then the laminated sample was placed in a box furnace as in Example 3. The furnace and sample were allowed to cool down to ambient temperature. The result, shown in the side sectional image of FIG. 18, was a transparent glass substrate having nanostructures.

Example 6 (Promerus/PermaNew 6000/Cyclotene, UV Curable)

A solution of 50 wt % MIBK to 50 wt % PDM 1086 was hand coated on the backside of a 0.051 mm (0.002 inch) thick T50 siliconized PET release liner using a notch bar coater with the gap set to 200 microns. The coating was dried in a solvent oven at 120° C. for 5 minutes.

A release coating was applied to a polymer tool having 600 nm pitch linear grooves by depositing a silicon containing layer by plasma deposition using a Plasma-Therm batch reactor (Plasma-Therm Model 3032 available from Plasma-Therm, St. Petersberg, Fla.). The coated film was embossed in a nip under a pressure of 552 kPa (80 psi) against the polymer tool at a temperature of 138° C. (280° F.). Embossing line speed was approximately 0.3 m/min (1 foot per minute). The polymer tool was left in contact with the coated film.

PDM 1086 is sensitive to 365 nm radiation. The energy required to crosslink the PDM 1086 is 200-1000 mJ/cm$^2$ from an appropriate UV source. The sample stack was exposed to UV light by passing the sample 4 times through a UV processor with medium pressure mercury arc lamps (RPC Industries UV Processor QC 120233AN/DR, Plainfield, Ill.) at a rate of 15.2 m/min (50 ft/min). The sample was then placed in an oven at 90° C. for 4 mins for as a post cure step to advance the crosslinking reaction. The sample was removed from the oven and allowed to cool to room temperature, then the polymer tool was removed from the coated film, leaving the cured PDM 1086 with an embossed structure on the backside of the T50 siliconized PET release liner. To reach final cure, the embossed PDM 1086 film was placed in an oven at 160° C. for 60 mins.
Backfill Layer Coating A piece of the embossed film was backfilled with the PermaNew 6000 product as described in Example 4.
Adhesion Promotion Layer Coating A piece of the backfilled sample was coated with the CYCLOTENE 3022 product as in Example 1.
Lamination to Glass The CYCLOTENE 3022 coated sample was laminated to a 50 mm×50 mm polished glass slide, as in Example 1.
Sacrificial Template Layer Removal The T50 siliconized PET release liner was removed and the laminated sample was placed in an inert atmosphere furnace (Lindberg Blue M muffle furnace model 51642-HR, Asheville, N.C., USA). The sample was fired in a Nitrogen atmosphere with the Oxygen concentration of less than 10 ppm. The temperature was ramped from 25° C. to 350° C. at a rate of approximately 5° C./min, then the temperature was ramped from 350° C. to 425° C. at approximately 1° C./min. The furnace was held at 425° C. for two hours and then the furnace and sample were allowed to cool down naturally.

Example 7 (PP/QPAC 100/PermaNew 6000/Cyclotene, Extrusion Replication)

Sacrificial Material Layer Co-Extrusion and Embossing

A co-extruded film consisting of an approximately 10 micron thick layer of QPAC 100 (extruded through a 0.75 inch diameter single screw extruder, at a temperature of 375° F.) and an approximately 200 micron thick layer of polypropylene 1024 (extruded through two 1.25 inch diameter single screw extruders at a temperature of 375° F.) was created via a three manifold, 10 inch wide extrusion die.

This co-extruded film immediately was drawn from the extrusion die and embossed in a nip under a pressure of 1.15 kN/cm (650 pounds per lineal inch) against a metal master tool with 600 nm pitch linear sawtooth grooves at a temperature of 104° C. with a nip roll was held at 96° C. The layers of the co-extruded film were arranged so that the QPAC 100 layer contacted the metal master tool. Embossing line speed was 7.62 m/min (25 feet/min).

Backfill Layer Coating

A section of the co-extruded film was treated with an air corona in a roll to roll process using a dual ceramic bar apparatus powered by a Universal Compak power supply (Enercon Industries Corporation, Menomonee Falls, Wis.). The system was configured to apply 0.75 J to the sample at 1.5 m/min (5 ft/min) in air, with a 3.2 mm (⅛ inch) gap between the ceramic bar and the sample.

A sample of the corona treated embossed film (≈2 in×3 in) was coated with PermaNew 6000, which was applied to the embossed film sample by spin coating. A glass microscope slide was used to support the film during the coating process. The spin parameters were 500 rpm/5 sec (solution application), 5000 rpm/15 sec (spin down).

The sample was removed from spin coater and placed on a hotplate at 70° C. for 5 min to complete the drying process. The sample was then cured at 70° C. for 4 hours in an oven.

Adhesion Promotion Layer Coating

Polished glass slides, 50 mm×50 mm×0.7 mm, were cleaned with a lint free cloth, treated in an ultrasonic wash chamber for 20 min with detergent, and then placed for 20 minutes each in two cascading rinse chambers with heated water. The slides were then dried for 20 minutes in an oven with circulating air.

CYCLOTENE 3022 (Dow Chemical, Midland Mich.) was diluted to 16 wt % with mesitylene and then spin coated onto a polished glass slide. The spin parameters were 500 rpm/5 sec (solution application), 3000 rpm/15 sec (spin down), and 1000 rpm/20 sec (dry).

The sample was removed from spin coater and placed on a hotplate at 70° C. for 5 min to complete the drying process.

Lamination to Glass

The coated sample was laminated at 230° F., coating side down, to the Cyclotene coated cleaned glass slide using a thermal film laminator (GBC Catena 35, GBC Document Finishing, Lincolnshire, Ill.).

Sacrificial Template Removal

The polypropylene layer was removed, and the laminated sample was placed in a box furnace (Lindberg Blue M box furnace model BF51732PC-1, Asheville N.C., USA) and brought from 25° C. to 200° C. at a rate of approximately 1° C./min. The furnace was held at 200° C. for 30 minutes. The temperature was raised to 300° C. and held for three hours to decompose the sacrificial material. The furnace and sample were allowed to cool down to ambient temperature. The result was a transparent glass substrate having nanostructures.

The invention claimed is:

1. A method for transferring a structured layer to a permanent receptor, comprising the steps of:
   providing a lamination transfer film, comprising:
      a carrier substrate having a substantially planar releasable surface;
      a sacrificial template layer having a first surface applied to the releasable surface of the carrier substrate and having a second surface opposite the first surface, wherein the second surface comprises a non-planar structured surface; and
      a thermally stable backfill layer applied to the second surface of the sacrificial template layer, wherein the backfill layer has a structured surface corresponding with and applied to the non-planar structured surface of the sacrificial template;
   applying the lamination transfer film to a permanent receptor with the backfill layer applied to the permanent receptor, wherein the permanent receptor is a bottom-emitting AMOLED backplane, a top-emitting AMOLED backplane, or an OLED solid state lighting substrate;
   removing the carrier substrate while leaving at least a portion of the sacrificial template layer on the backfill layer; and
   removing the sacrificial template layer from the backfill layer while leaving the structured surface of the backfill layer substantially intact.

\* \* \* \* \*